(12) United States Patent
Kikuchi et al.

(10) Patent No.: US 8,426,548 B2
(45) Date of Patent: Apr. 23, 2013

(54) POLYIMIDE FILM AND ADHESIVE FILM AND FLEXIBLE METAL-CLAD LAMINATE BOTH OBTAINED WITH THE SAME

(75) Inventors: Takashi Kikuchi, Otsu (JP); Hisayasu Kaneshiro, Uji (JP)

(73) Assignee: Kaneka Corporation, Osaka (JP)

( * ) Notice: Subject to any disclaimer, the term of this patent is extended or adjusted under 35 U.S.C. 154(b) by 528 days.

(21) Appl. No.: 11/663,622

(22) PCT Filed: Sep. 14, 2005

(86) PCT No.: PCT/JP2005/016889
§ 371 (c)(1), (2), (4) Date: Mar. 22, 2007

(87) PCT Pub. No.: WO2006/033267
PCT Pub. Date: Mar. 30, 2006

(65) Prior Publication Data
US 2009/0197110 A1   Aug. 6, 2009

(30) Foreign Application Priority Data
Sep. 24, 2004 (JP) .................................. 2004-277224
Nov. 17, 2004 (JP) .................................. 2004-333666

(51) Int. Cl.
*C08G 73/00* (2006.01)
*B32B 7/12* (2006.01)
*B32B 15/08* (2006.01)

(52) U.S. Cl.
USPC ......... 528/170; 428/349; 428/458; 428/473.5

(58) Field of Classification Search .................. 428/458, 428/349, 473.5; 528/170
See application file for complete search history.

(56) References Cited

U.S. PATENT DOCUMENTS

| 4,535,105 | A  | * | 8/1985 | Inaike et al. ................. 524/104 |
| 5,196,500 | A  |   | 3/1993 | Kreuz et al. |
| 5,202,412 | A  | * | 4/1993 | Auman et al. ................ 528/353 |
| 6,277,495 | B1 | * | 8/2001 | Sawasaki et al. ............. 428/458 |
| 6,335,416 | B1 |   | 1/2002 | Nojiri et al. |
| 6,350,844 | B1 |   | 2/2002 | Ono et al. |
| 2004/0097694 | A1 | | 5/2004 | Fujihara et al. |
| 2006/0054262 | A1 | | 3/2006 | Kikuchi et al. |

FOREIGN PATENT DOCUMENTS

| JP | 4-207094 | 7/1992 |
| JP | 06-333994 | 12/1994 |
| JP | 07-041556 | 2/1995 |
| JP | 09-199830 | 7/1997 |
| JP | 10-036506 | 2/1998 |

(Continued)

OTHER PUBLICATIONS

Patent Abstracts of Japan, Publication No. 2001-072781, Mar. 21, 2001 (2pg).

(Continued)

*Primary Examiner* — Kevin R Kruer
(74) *Attorney, Agent, or Firm* — Kagan Binder, PLLC

(57) ABSTRACT

A polyimide film which, especially when superposed on a metal layer by the laminating method, has the function of diminishing the thermal distortion to be imposed on the material; an adhesive film and a flexible metal-clad laminate each comprising or obtained with the polyimide film. the polyimide film is obtained by reacting an aromatic diamine with an aromatic acid dianhydride and imidiating the polyamic acid obtained, and has a storage elastic modulus in a specific range.

17 Claims, 2 Drawing Sheets

FOREIGN PATENT DOCUMENTS

| | | |
|---|---|---|
| JP | 10-070157 | 3/1998 |
| JP | 10-126019 | 5/1998 |
| JP | 10-130594 | 5/1998 |
| JP | 11-335555 | 12/1999 |
| JP | 2000-063543 | 2/2000 |
| JP | 2000-159887 | 6/2000 |
| JP | 2000-297163 | 10/2000 |
| JP | 2001-072781 | 3/2001 |
| JP | 2001-315256 | 11/2001 |
| JP | 3289295 | 3/2002 |
| JP | 2002-322276 | 11/2002 |
| JP | 2002-326280 | 11/2002 |
| JP | 2002-326308 | 11/2002 |
| JP | 2002-338930 | 11/2002 |
| JP | 2004-143300 | 5/2004 |
| JP | 2004-188962 | 7/2004 |
| JP | 2004-346210 | 12/2004 |
| JP | 2005-178242 | 7/2005 |
| JP | 2005-199481 | 7/2005 |
| JP | 2005-200435 | 7/2005 |
| WO | 00/11066 | 3/2000 |

OTHER PUBLICATIONS

Patent Abstracts of Japan, Publication No. 2000-297163, Oct. 24, 2000 (1 pg).
Patent Abstracts of Japan, Publication No. 2000-063543, Feb. 29, 2000 (1 pg).
Patent Abstracts of Japan, Publication No. 2004-143300, May 20, 2004 (1 pg).
Patent Abstracts of Japan, Publication No. 2001-315256, Nov. 13, 2001 (1 pg).
Patent Abstracts of Japan, Publication No. 2002-322276, Nov. 8, 2002 (1 pg).
Patent Abstracts of Japan, Publication No. 2000-159887, Jun. 13, 2000 (1 pg).
Patent Abstracts of Japan, Publication No. 10-130594, May 19, 1998 (1 pg).
Patent Abstracts of Japan, Publication No. 10-126019, May 15, 1998 (1 pg).
Patent Abstracts of Japan, Publication No. 10-070157, Mar. 10, 1998 (1 pg).
Patent Abstracts of Japan, Publication No. 10-036506, Feb. 10, 1998 (1 pg).
Patent Abstracts of Japan, Publication No. 06-333994, Dec. 2, 1994 (1 pg).
Patent Abstracts of Japan, Publication No. 09-199830, Jul. 31, 1997 (1 pg).
Patent Abstracts of Japan, Publication No. 2002-326308, Nov. 12, 2002 (1 pg).
Patent Abstracts of Japan, Publication No. 2002-326280, Nov. 12, 2002 (1 pg).
International Search Report, Nov. 22, 2005, (2 pgs).
English translation of the International Preliminary Report on Patent Ability (6 pgs) Date of issuance of report Mar. 27, 2007.
English-language translation of JP 4-207094, 15 pgs.
English-language machine translation of JP2005-199481, 19 pgs.
English-language machine translation of JP2005-178242, 19 pgs.
Abstract of JP07-041556, 1 page.
Abstract of JP2005-200435, 1 page.
Abstract of JP2002-338930, 1 page.
Abstract of JP11-335555, 1 page.
Machine Translation of JP2004-346210, 9 pages.
Abstract of WO00/11066, 1 page.
International Search Report of PCT/JP2006/308660, 6 pages.
English translation of International Preliminary Report on Patentability, PCT/JP2006/308660, 5 pages, (Oct. 2007).
English translation of International Preliminary Report on Patentability, PCT/JP2006/314728, 4 pages, (Feb. 2008).
Office Action mailed Oct. 7, 2010 in U.S. Appl. No. 11/918,558, 16 pages.
Office Action mailed Oct. 8, 2010 in U.S. Appl. No. 11/989,851, 13 pages.

\* cited by examiner

POLYIMIDE FILM AND ADHESIVE FILM AND FLEXIBLE METAL-CLAD LAMINATE BOTH OBTAINED WITH THE SAME

CROSS-REFERENCE TO RELATED APPLICATIONS

This application is a National Stage filing of International Application No. PCT/JP2005/016889, having a PCT publication number of WO 2006/033267 A1, which was filed on Sept. 14, 2005, which in turn claims priority from Japan patent application number 2004-277224, which was filed on Sept. 24,2004, and claims priority from Japan patent application number 2004-333666, which was filed on Nov. 17, 2004.

TECHNICAL FIELD

The present invention relates to a polyimide film being capable of suppressing dimensional change in production of a flexible metal-clad laminate, specifically, the polyimide film which has excellent dimensional stability when an adhesive layer is layered on the polyimide film and a metal foil is laminated on the adhesive layer by a thermal laminating method, and an adhesive film and a flexible metal-clad laminate using the same.

BACKGROUND ART

The recent trends toward lighter, smaller, and higher-density electronic products have increased the demand for various printed wiring boards. In particular, the demand for a flexible printing wiring board (hereinafter, also referred to as "FPC)") has shown a notable increase. The flexible printed wiring board is constituted from an insulating film and a circuit formed from a metal foil disposed on the film.

Typically, the flexible metal-clad laminate, from which the flexible printing wiring board is produced, is produced by bonding a metal foil onto a surface of a substrate with an adhesive material under heating and pressure, the substrate being a flexible insulating film made from an insulating material of various kinds. Polyimide films and the like are preferred as the flexible insulating film, and thermosetting adhesives such as epoxy and acrylic adhesives are typically used as the adhesive material. (Hereinafter, FPCs made using thermosetting adhesives are also referred to as "three-layered FPCs".)

Thermosetting adhesives are advantageous in that bonding at relatively low temperatures is possible. However, requirements for properties, such as heat resistance, flexibility, and electrical reliability, are becoming more stringent, and it is possible that three-layer FPCs using thermosetting adhesives will have difficulty in meeting these stringent requirements. In order to overcome this problem, FPCs (hereinafter also referred to as "two-layer FPCs") using thermoplastic polyimide as the bonding layer or made by directly forming a metal layer on the insulating film have been proposed. The two-layer FPCs have properties superior to those of the three-layer FPCs, and the demand for the two-layer FPCs is expected to grow in the future.

A flexible metal-clad laminate for a two-layered FPC may be prepared by a casting method, a metalizing method, or a laminating method, for example. In the casting method, a polyamic acid, which is a precursor of a polyimide, is cast and spread on a metal foil and is imidized. In the metalizing method, a metal layer is formed directly on a polyimide film by sputtering or plating. In the laminating method, a polyimide film and a metal foil are adhered together via a thermoplastic polyimide. The laminating method is more excellent than the others because it can provide a wider range of thickness of the metal foil than does the casting method and requires a lower apparatus cost than the metalizing method. As an apparatus for the lamination, heat roll laminating apparatus, double belt press apparatus or the like is used, in which materials in a rolled form are continuously unrolled to be fed in for the lamination. For better productivity, the heat roll laminating method is more preferable among them.

In the production of the conventional three-layered FPC by the laminating method, it is possible to carry out the lamination at laminating temperatures less than 200° C. (see Patent Document 1), because a thermosetting resin is used to form the adhesive layer. On the other hand, a thermoplastic polyimide is used to form the adhesive layer in the two-layered FPC. Therefore, it is necessary for the two-layered FPC to apply a high temperature of 200° C. or higher, in some cases, a temperature of approximately 400° C., in order to heat the adhesive layer to be adhesive. This induces distortion remained in the resultant flexible metal-clad laminate obtained by the lamination. Such distortion would result in dimensional changes when the flexible metal-clad laminate is wired by etching and when solder reflow is carried out for mounting elements on the resulting flexible printing wiring board.

Particularly in the laminating method, heat is continuously applied to imidize a polyamic acid, which is a precursor of a thermoplastic polyimide, in order to form an adhesive layer including the thermoplastic polyimide on the polyimide film, after the polyamic acid is cast and spread. Moreover, heat and pressure are continuously applied again, in order to laminate the metal foil. Therefore, heat is often applied to materials under tensile force. As a result, different heat stresses are produced in an MD direction and a TD direction. More specifically, the lamination applies a force on the film to expend it in the MD direction to which the tensile force is applied but to shrink it in the TD direction. As a result, this distortion is released when etching the metal foil away from the flexible metal-clad board to be wired and when heating the flexible printed wiring board by solder reflow. The release of the distortion causes shrinkage in the MD direction and expansion in the TD direction.

Recently, the wiring on the substrates is getting finer and finer in order to achieve reductions in size and weight of electronic devices. Accordingly, smaller elements are mounted in higher densities. Therefore, a large dimensional change after the formation of the fine wiring would shift the wires from positions to which the elements are to be mounted according to design, thereby failing to connect the elements with the substrate sufficiently.

In view of this, effort is made in order to suppress the dimensional changes by controlling a pressure to be applied in lamination with pressure or controlling the tensile force on the adhesive film (See Patent Document 2 or 3). Although the aforesaid means improves the dimensional changes, the improvement is not enough and further improvement is expected to suppress the dimensional changes.

Recently, in particular, a required level tends to become severe in solder resistance against moisture absorption, due to introduction of lead-free solder. Although, in order to clear the requirement, the adhesive layer is being changed so as to have higher Tg (glass transition temperature), the temperature necessary for the lamination becomes inevitably high consequently. Therefore, because the heat stress on the materials becomes larger, the materials are prone to the dimensional changes. Accordingly, it becomes necessary to design the material so that the heat stress is more efficiently suppressed.

At present, the insulating layer used for the two-layer FPCs has thickness of 25 μm (1 mill) in the main. However, as to the thickness of the insulating layer, there is uprising demand for reduction to equal to or less than 15 μm, in other words, a demand for "a half mill", in order to solve problems such as further reduction of a mounting space on the substrate and spring-back or the like. Because the thickness of the adhesive film becomes thinner in the "half mill" two-layer FPCs, influence from the heat stress becomes larger at the lamination. Accordingly, it is more difficult to improve the dimensional changes of the "half mill" two-layer FPCs, compared with the one mill two-layer FPCs.

[Patent Document 1]
Japanese Unexamined Patent Publication, Tokukaihei, No. 9-199830
[Patent Document 2]
Japanese Unexamined Patent Publication, Tokukai, No. 2002-326308
[Patent Document 3]
Japanese Unexamined Patent Publication, Tokukai, No. 2002-326280.

DISCLOSURE OF INVENTION

Technical Problem

The present invention is attained in view of the problems mentioned above. An object of the invention is to provide a polyimide film being capable of suppressing dimensional changes in production of a flexible metal-clad laminate, in particular, the polyimide film having a function to suppress heat distortion of materials in the production by a laminating method, and an adhesive film obtained by providing at least one side of the polyimide film with an adhesive layer, a flexible metal-clad laminate, which is obtained by bonding a metal foil by a thermal laminating method on the adhesive film, being capable of suppressing the occurrence of the dimensional changes, in particular, the flexible metal-clad laminate being capable of suppressing the dimensional changes even in a case of a thin adhesive film.

Technical Solution

As a result of diligent studies, the inventors of the present invention uniquely found that (i) by controlling a storage modulus of a polyimide film within a particular range, it is possible to suppress a dimensional change that would occur in production process for a flexible copper-clad laminate using the same, and (ii) especially, by using the polyimide film as a core layer of an adhesive film on at least one side of which an adhesive layer is provided, it is possible to alleviate thermal distortion that would occur in thermal lamination thereby to effectively suppress the dimensional change. The present invention is based on the finding. That is, the aforementioned object can be attained by the novel polyimide film, and adhesive film and flexible metal-clad laminate using the same.

(1) A polyimide film produced by imidizing a polyamic acid prepared by reacting an aromatic diamine and an aromatic dianhydride, the polyimide film satisfying all the conditions (i) to (iv):

(i) an inflection point of a storage modulus of the polyimide film is in a range of 270 to 340° C.;

(ii) a peak top of tan δ is in a range of 320 to 410° C., where tan δ is a value obtained by dividing a loss modulus by the storage modulus;

(iii) the storage modulus at 380° C. is in a range of 0.4 to 2.0 GPa; and (iv) the storage modulus $\alpha_1$ (GPa) at the inflection point and the storage modulus $\alpha_2$ (GPa) at 380° C. is in a range of the following Equation (1):

$$85 \geq \{(\alpha_1 - \alpha_2)/\alpha_1\} \times 100 \geq 65 \quad (1).$$

(2) The polyimide film as set forth in (1) being obtained by performing imidization with a polyamic acid solution obtained by carrying out the steps of:

(a) reacting, in an organic polar solvent, an aromatic acid dianhydride and an aromatic diamine compound being greater in a molar amount than the aromatic acid dianhydride, so as to obtain a prepolymer having an amino group at each end;

(b) sequentially, further adding an aromatic diamine compound; and (c) performing polymerization after further adding an aromatic acid dianhydride in an amount that makes up a substantially equimolar amount of the aromatic acid dianhydride to the aromatic diamine in an overall process.

(3) The polyimide film as set forth in (2), wherein the aromatic diamine compound used in step (a) is a diamine having a soft structure, and the aromatic diamine compound used in step (b) is a diamine having a rigid structure.

(4) The polyimide film as set forth in any one of (1) to (3), wherein 3,4'-diaminodiphenylether is 10 mol % or more to the whole diamine component in the production of the polyimide film.

(5) The polyimide film as set forth in any one of (1) to (4), having a tensile modulus of 6.0 GPa or greater.

(6) The polyimide film as set forth in any one of (1) to (5), wherein the polyimide film has a moisture expansion coefficient of 13 ppm/° C. or less, the moisture expansion coefficient being measured after the polyimide film is kept at 50° C. and 40% RH. for 3 hours and then at 80% RH. for 3 hours.

(7) The polyimide film as set forth in any one of (1) to (6), having a linear expansion coefficient of 15 ppm/° C. or less from 100° C. to 200° C.

(8) The polyimide film as set forth in any one of (1) to (7), having an angle of molecular orientation axis in a range of −15 degrees to 15 degrees to a film transfer direction (MD direction).

(9) The polyimide film as set forth in (8) wherein the polyimide film is obtained by a method for producing an organic insulating film, the method including:

(A) polymerizing to form a polyamic acid;

(B) flow-casting and spreading a composition containing the polyamic acid and an organic solvent onto a support and forming a gel film;

(C) peeling off the resulting gel film from the support and holding the gel film at its edges; and (D) transferring the film held at its edges in a heating furnace, wherein the step (D) at least includes the step of (D-1) transferring the film held in a manner such that the film has substantially no tension in a film width direction (TD direction) in at least part of the step (D).

(10) An adhesive film comprising:
a polyimide film as set forth in any one of (1) to (9); and
an adhesive layer on at least one side of the polyimide film, the adhesive layer containing a thermoplastic polyimide.

(11) The adhesive film as set forth in (10), wherein:
the thermoplastic polyimide has a glass transition temperature (Tg) of 230° C. or higher.

(12) The adhesive film as set forth in (10) or (11) being 15 μm or less in film thickness.

(13) A flexible metal-clad laminate produced by adhering an adhesive film as set forth in any one of (10) to (12) and a metal foil by using a heat roll laminating apparatus having one or more pairs of metal rollers.

(14) The flexible metal-clad laminate as set forth in (13), wherein the step of adhering includes:
performing lamination in which a protective material is provided between the metal foil and one roller, the protective film being made of a non-thermoplastic polyimide or a thermoplastic polyimide which has a glass transition temperature (Tg) that is higher than a lamination temperature by 50° C. or more; and
separating the protective material after post-lamination cooling.

(15) The flexible metal-clad laminate as set forth in (14), wherein before the separating of the protective material but after the lamination, a laminate in which the protective film and the flexible metal-clad laminate are attached with each other is touched with a heating roller in a period in a range of 0.1 to 5 seconds, and the laminate is cooled before separating the protective material.

(16) The flexible metal-clad laminate as set forth in any one of (13) to (15), wherein a dimensional change of the flexible metal-clad laminate before and after heating the flexible metal-clad laminate at 250° C. for 30 minutes after the removal of the metal foil is in a range of −0.04 to +0.04% in each of an MD direction and a TD direction.

(17) The flexible metal-clad laminate as set forth in any one of (13) to (15), wherein the flexible metal-clad laminate has an adhesive film of 15 μm in thickness, and a dimensional change of the flexible metal-clad laminate before and after heating the flexible metal-clad laminate at 250° C. for 30 minutes after the removal of the metal foil is in a range of −0.05 to +0.05% in each of an MD direction and a TD direction.

Effect of Invention

The polyimide film of the present invention can suppress a dimensional change that would occur in the production process of a flexible copper-clad laminate. Especially, the polyimide film has an inflection point of the storage modulus in order to alleviate heat stress during lamination operation and the storage modulus is controlled. As a result, the dimensional change is effectively suppressed in a flexible metal-clad laminate prepared by adhering, by a lamination method, a metal foil on an adhesive film whose core is made of the polyimide film. More specifically, the dimensional change of the film before and after heating the film at 250° C. for 30 min after removal of the metal foil can be restrained within −0.04 to +0.04% in both the MD direction and TD direction. Therefore, the polyimide film of the present invention is preferably applicable to FPC on which fine wiring has been formed, or the like. The polyimide film of the present invention can solve problems such as positional shifting etc.

BEST MODE FOR CARRYING OUT THE INVENTION

An embodiment of the present invention is explained below. First, a polyimide film of the present invention is described on the basis of one example of the embodiment.
(Polyimide Film of Present Invention)
According to the present invention, if a polyimide film has all of the following physical properties (1) through (4), dimensional changes can be effectively suppressed in production of a flexible metal-clad laminate using the polyimide film.

(1) An inflection point of a storage modulus is in a range of 270 to 340° C.
(2) A peak top of tan δ, which is a value obtained by dividing a loss modulus by the storage modulus, is in a range of 320 to 410° C.
(3) The storage modulus at 380° C. is in a range of 0.4 to 2.0 GPa.
(4) The storage modulus $\alpha_1$ (GPa) at the inflection point and the storage modulus $\alpha_2$ (GPa) at 380° C. is in a range of the following Equation (1):

$$85 \geq \{(\alpha_1-\alpha_2)/\alpha_1\} \times 100 \geq 65 \tag{1}$$

Now, the inflection point of the storage modulus is explained. From the view of heat stress alleviation at lamination of a metal foil by a laminating method, it is necessary to have the inflection point of the storage modulus in a range of 270 to 340° C., and preferably, in a range of 280 to 330° C. In a case where the inflection point of the storage modulus is below this range, a core layer starts to soften at a temperature for evaluating the dimensional changes after heating the flexible metal-clad laminate (250° C. is often used for the evaluation for the two-layer FPCs). Therefore, the low inflection point becomes a cause of deteriorating the dimensional changes. On the contrary, in a case where the inflection point of the storage modulus is above the aforementioned range, the core layer starts to soften at a high temperature. Accordingly, heat stress is not sufficiently alleviated at thermal lamination. Consequently, as with the low inflection point, this becomes a cause of the dimensional changes.

The peak top of tan δ, which is a value obtained by dividing a loss modulus by the storage modulus, needs to be in a range of 320 to more than 410° C., and, preferably, in a range of 330 to 400° C. In a case where the peak top of tan δ is below the above-mentioned range, the temperature at which the tan δ starts to increase is at substantially 250° C. or equal to or less than 250° C. Accordingly, because the core layer may starts to soften when the dimensional change is measured, it is possible that a ratio of the dimensional change deteriorates. On the contrary, in a case where the peak top of tan δ is higher than the above-mentioned range, an excessively high temperature is necessary for softening the core layer to a level enough to alleviate distortion. Accordingly, a present laminating apparatus does not sufficiently alleviate the heat stress and may deteriorate the dimensional changes. Consequently, a case where the peak top of tan δ goes off from the above-mentioned range, as with the inflection point of the storage modulus, deteriorates the dimensional changes.

The storage modulus at 380° C. needs to be in a range of 0.4 to 2.0 GPa, preferably, in a range of 0.6 to 1.8 GPa, and, more preferably, in a range of 0.7 to 1.6 GPa. As a result of diligent studies, the inventors of the present invention found that the glass transition temperature of an adhesive layer needs to be in a range of 240 to 280° C. so that the resulting flexible metal-clad laminate has solder heat resistance as well, while the dimensional changes can be suppressed as mentioned above. In such a case, the laminating temperature needs to be substantially 380° C. in order to efficiently carry out the lamination. Consequently, a storage modulus control at 380° C. becomes very important. In a case where the storage modulus at 380° C. is below the above-mentioned range, the film loses a self-supporting ability when the film is imidized or subjected to the thermal lamination. This deteriorates productivity of the film or an appearance of the flexible metal-clad laminate obtained. On the contrary, in a case where the storage modulus at 380° C. is higher than the above-mentioned range, the core layer will not be sufficiently softened. Consequently, the film does not exhibit a sufficient heat stress alleviation effect at the thermal lamination. This leads to greater dimensional changes.

The inventors of the present invention also studied a relation between the storage modulus $\alpha_1$ (GPa) at the inflection point and the storage modulus $\alpha_2$ (GPa) at 380° C. As a result, the inventors of the present invention found that it is important that the relation between the storage modulus $\alpha_1$ (GPa) and the storage modulus $\alpha_2$ (GPa) are in the range of the following Equation (1) below in order to suppress the dimensional changes that occur in the production process of the flexible metal-clad laminate:

$$85 \geq \{(\alpha_1-\alpha_2)/\alpha_1\} \times 100 \geq 65 \qquad (1).$$

In a case where $\{(\alpha_1-\alpha_2)/\alpha_1\} \times 100$ is below the above-mentioned range, the storage modulus is not lowered sufficiently. Accordingly, the film does not exhibit a sufficient heat stress alleviation effect at the thermal lamination. This deteriorates the dimensional changes of the flexible metal-clad laminate obtained. On the contrary, in a case where $\{(\alpha_1-a_2)/\alpha_1\} \times 100$ is higher than the above-mentioned range, the film loses a self-supporting ability. This deteriorates productivity of the film or an appearance of the flexible metal-clad laminate obtained.

A polyimide film that satisfies all of the four conditions mentioned above is necessary in order to obtain a flexible metal-clad laminate having an excellent dimensional stability.

The polyimide film that has all of the four characteristics mentioned above has not been known so far. A method of obtaining such polyimide film is not specifically limited. The method is explained by one example below. The polyimide film of the present invention can be obtained from a solution of the polyamic acid which is a precursor of the polyimide. Typically, the polyamic acid is produced by (i) dissolving substantially equimolar amounts of an aromatic diamine and an aromatic acid dianhydride in an organic solvent and (ii) stirring a polyamic acid organic solvent solution prepared in (i) under controlled temperature conditions until polymerization of the acid dianhydride and the diamine is completed. The polyamic acid solution thus produced is obtained at a concentration of 5 to 35 percent by weight and, preferably, 10 to 30 percent by weight. A solution having a concentration within this range has an adequate solution viscosity, and gives the obtained polyamic acid an adequate molecular weight.

The physical properties of the polyimide film of the present invention can be controlled not only by structures of the aromatic diamine and the aromatic acid dianhydride, which are raw material monomers, but also by controlling the order of adding the monomers. Accordingly, in order to obtain the polyimide film of the present invention, it is preferable to imidize a polyamic acid solution obtained by the following processes including steps (a) through (c):

(a) reacting, in an organic polar solvent, an aromatic acid dianhydride and an aromatic diamine compound being greater in a molar amount than the aromatic acid dianhydride, so as to obtain a prepolymer having an amino group at each end;

(b) sequentially, further adding an aromatic diamine compound; and (c) performing polymerization after further adding an aromatic acid dianhydride in an amount that makes up a substantially equimolar amount of the aromatic acid dianhydride to the aromatic diamine in an overall process.

Examples of an aromatic diamine appropriate for use as the raw material monomer of the polyimide film of the present invention encompass 4,4'-diaminodiphenylpropane, 4,4'-diaminodiphenylmethan, benzidine, 3,3'-dichlorobenzidine, 3,3'-dimethylbenzidine, 2,2'-dimethylbenzidine, 3,3'-dimethoxybenzidine, 2,2'-dimethoxybenzidine, 4,4'-diaminodiphenylsufide, 3,3'-diaminodiphenylsulfone, 4,4'-diaminodiphenylsulfone, 4,4'-diaminodiphenyl ether, 3,3'-diaminodiphenyl ether, 3,4'-diaminodiphenyl ether, 1,5-diaminonaphthalene, 4,4'-diaminodiphenyldiethylsilane, 4,4'-diaminodiphenylsilane, 4,4'-diaminodiphenylethylphosphineoxide, 4,4'-diaminodiphenyl N-methylamine, 4,4'-diaminodiphenyl N-phenylamine, 1,4-diaminobenzene(p-phenylenediamine), 1,3-diaminobenzene, 1,2-diaminobenzene, bis {4-(4-aminophenoxy)phenyl} sulfone, bis(4-(3-aminophenoxy)phenyl) sulfone, 4,4'-bis(4-aminophenoxy)biphenyl, 4,4'-bis(3-aminophenoxy) biphenyl, bis {4-(4-aminophenoxy)phenyl} propane, 1,3-bis(3-aminophenoxy) benzene, 1,3-bis(4-aminophenoxy) benzene, 3,3'-diaminobenzophenone, 4,4'-diaminobenzophenone, and the like compounds.

It is preferable to obtain a prepolymer constituting a block component derived from a thermoplastic polyimide in the above-mentioned step (a). In order to obtain the prepolymer constituting a block component derived from a thermoplastic polyimide, it is preferable to react a diamine having flexibility (diamine having a soft structure) with an acid dianhydride. In the present invention, the block component derived from a thermoplastic polyimide is a component whose polymer composes a film that melts and does not retain its original shape when heated to a temperature of 400° C. Specifically, an aromatic diamine compound and an aromatic acid dianhydride component can be selected by evaluating whether the polyimide obtained by reacting the aromatic acid dianhydride component used in the step (a) with a substantially equimolar amount of an aromatic diamine compound used in the step (a) melts at the above-mentioned temperature, or does not retain an original shape of the film at the above-mentioned temperature. By reactions in steps (b) and (c) with thus obtained prepolymer, it is possible to obtain a polyamic acid including thermoplastic portions in some parts of its molecular chain. If the aromatic diamine compound and the aromatic acid dianhydride component used in steps (b) and (c) are so selected to polymerize to produce such a polyamic acid that an ultimately obtained polyimide becomes non-thermoplastic, the polyimide film as a result of imidization of the copolymer thus obtained includes a thermoplastic portion. Consequently, the polyimide film exhibits the inflection point in a high temperature range. Moreover, it becomes possible to prevent that the storage modulus lowers drastically in the high temperature range by controlling a ratio of the thermoplastic portion to non-thermoplastic portion in the molecular chain, because most part of the molecular chain has a non-thermoplastic structure.

The diamine having flexibility (diamine having a soft structure) (i.e. soft diamine) in the present invention is a diamine including a soft structure, for example, an ether group, a sulfonic group, a ketone group, or a sulfide group. The diamine preferably used is represented by the following general Formula (1):

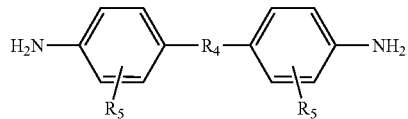

Formula (1)

where $R_4$ is a group selected from a group including a bivalent organic group or a bivalent linking group, represented by General Formula Group (1):

General Formula Group (1)

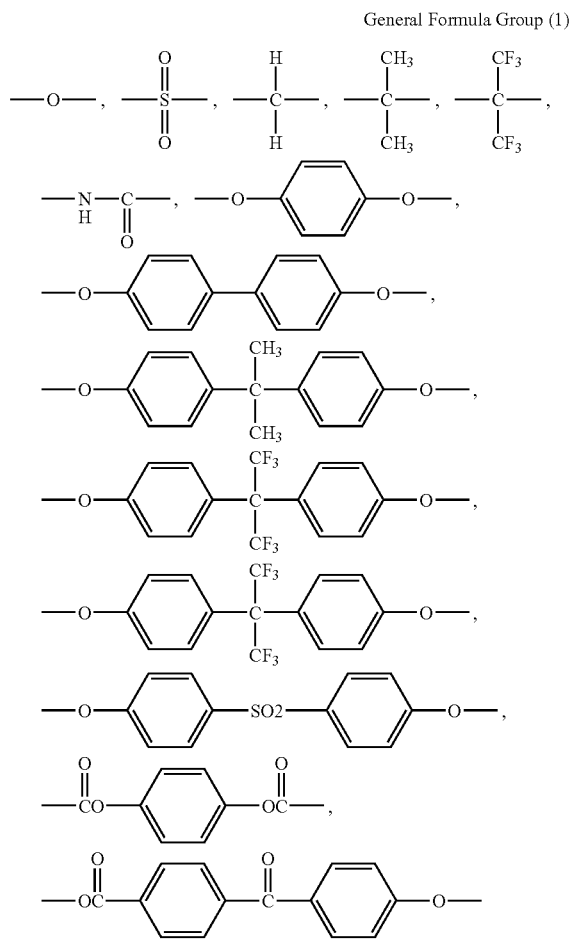

where $R_5$ is one, identically or independently, selected from the group consisting of H—, $CH_3$—, —OH, —$CF_3$, —$SO_4$, —COOH, —CO—$NH_2$, Cl—, Br—, F—, and $CH_3O$—.

The diamine component used in the step (b) is preferably a diamine having a rigid structure (i.e. rigid diamine), thereby the ultimately obtained film can be non-thermoplastic. The diamine including the rigid structure in the present invention is represented by Formula (2):

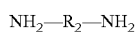

Formula (2)

where R2 is a group selected from an bivalent aromatic group represented by General Formula Group (2):

General Formula Group (2)

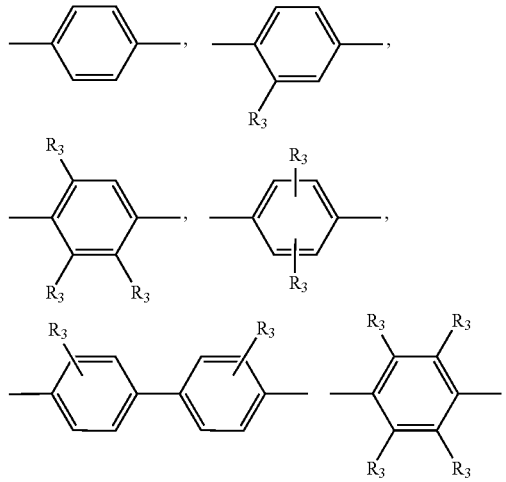

where $R_3$ is one, identically or independently, selected from the group consisting of H—, $CH_3$—, —OH, —$CF_3$, —$SO_4$, —COOH, —CO—$NH_2$, Cl—, Br—, F—, and $CH_3O$—.

A ratio of the rigid diamine and the soft diamine (diamine having flexibility) used here is, preferably, in a range of 80:20 to 20:80 in a molar ratio, more preferably, in a range of 70:30 to 30:70, and particularly preferably, in a range of 60:40 to 40:60. A molar ratio of the rigid diamine above the range may cause problems such that a glass transition temperature of the film obtained becomes too high; the storage modulus in a high temperature range barely lowers, and a liner expansion coefficient becomes too small. On the contrary, a molar ratio of the rigid diamine below the range may cause problems opposite to the problems that may occur in a case of a molar ratio of the rigid diamine above the range.

The soft diamines and the rigid diamines may be used in combination of plural kinds of respective diamines. However, in the polyimide film of the present invention, it is, in particular, preferable to use 3,4'-diaminodiphenyl ether as the soft diamine.

3,4'-diaminodiphenyl ether has only one ether bond that is a flexible portion, but one amino group of 3,4'-diaminodiphenyl ether bonds to a meta position. Among soft diamines, 3,4'-diaminodiphenyl ether has properties similar to a rigid diamine even though 3,4'-diaminodiphenyl ether is a soft diamine. Namely, 3,4'-diaminodiphenyl ether has an effect of decreasing the storage modulus, and also exhibits an effect of decreasing a little the linear expansion coefficient. Accordingly, physical properties can be easily balanced in a polyimide film obtained by using 3,4'-diaminodiphenyl ether together with a diamine including many flexible portions, for example, 1,3-bis(3-aminophenoxy)benzene or bis{4-(4-aminophenoxy)phenyl}propane.

An amount of 3,4'-diaminodiphenyl ether used is preferably equal to or more than 10 mol % of a whole diamine component, and, more preferably, equal to or more than 15 mol %. With 3,4'-diaminodiphenyl ether less than the above-mentioned amount, the effects mentioned above may not be sufficiently exhibited. On the other hand, an upper limit of the amount of 3,4'-diaminodiphenyl ether used is preferably equal to or less than 50 mol %, and, more preferably, equal to or less than 40 mol %. 3,4'-diaminodiphenyl ether more than the above-mentioned amount may result in too small linear expansion coefficient of the polyimide film obtained, due to a synergistic effect of 3,4'-diaminodiphenyl ether with the rigid diamine.

Examples of an acid dianhydride appropriate for use as the raw material monomer of the polyimide film of the present invention encompass pyromellitic dianhydride, 2,3,6,7-naphthalene tetracarboxylic dianhydride, 3,3',4,4'-biphenyltetracarboxylic dianhydride, 1,2,5,6-naphthalene tetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 4,4'-oxyphthalic dianhydride, 3,4'-oxyphthalic dianhydride, 2,2-bis(3,4-dicarboxyphenyl)propane dianhydride, 3,4,9,10-perylenetetracarboxylic dianhydride, bis(3,4-dicarboxyphenyl)propane dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, bis(3,4-dicarboxyphenyl)ethane dianhydride, oxydiphthalic dianhydride, bis(3,4-dicarboxyphenyl)sulfone dianhydride, p-phenylenebis(trimellitic acid monoester anhydride), ethylenebis(trimellitic acid monoester anhydride), bisphenol A bis(trimellitic acid monoester anhydride), and the like compounds. These compounds may be used solely or in combination at an appropriate ratio.

As with the diamines, acid dianhydrides are also sorted into an acid anhydride having a soft structure (i.e. soft acid dianhydride) and an acid anhydride having a rigid structure (i.e., rigid acid dianhydride). The former is used in the step (a) and the latter is used in the step (c). Preferable examples of a soft acid dianhydride used in the step (a) encompass benzophenonetetracarboxylic dianhydrides, oxyphthalic dianhydrides, and biphenyltetracarboxylic dianhydrides. On the other hand, preferable examples of a rigid acid dianhydride used in the step (c) encompass pyromellitic dianhydride. A preferable amount of the benzophenonetetracarboxylic dianhydrides, oxyphthalic dianhydrides, and biphenyltetracarboxylic dianhydrides used is in a range of 10 to 50 mol % to a whole acid dianhydride, more preferably, in a range of 15 to 45 mol %, and, particularly preferably in a range of 20 to 40 mol %. With soft acid dianhydride content in an amount less than the above-mentioned range, the use of only the soft diamine would result in too high glass transition temperature of the resultant polyimide film or would not decrease a storage modulus in a high temperature range sufficiently. On the contrary, soft acid dianhydride content in an amount more than the above-mentioned range may result in a problem such that film formation may become difficult because of an extremely low glass transition temperature or an extremely low storage modulus in a high temperature range.

On the other hand, when pyromellitic dianhydride is used, a preferable amount of pyromellitic dianhydride used is in a range of 40 to 100 mol %, more preferably, in a range of 50 to 90 mol %, and, particularly preferably in a range of 60 to 80 mol %. With the amount of pyromellitic dianhydride used in the above-mentioned range, the glass transition temperature and the storage modulus of the obtained polyimide film can be easily kept in a range preferable for use or film formation of the polyimide film.

The polyimide film of the present invention can exhibit a desired glass transition temperature and a desired storage modulus in a high temperature range, by using, in the above-mentioned range, determined kinds of an aromatic acid dianhydride and an aromatic diamine and a determined ratio thereof. However, in consideration of processing in the thermal laminating method, which is a processing method of an adhesive film as an application of the polyimide film, a tension modulus is preferably equal to or more than 6.0 GPa, and more preferably, equal to or more than 6.5 GPa. With a tension modulus less than the above-mentioned value, the polyimide film is prone to an influence of tension force. Consequently, a residual stress occurs on the flexible metal-clad laminate. This results in a cause of dimensional changes. Too thin thickness of the film would lead to low stiffness of the film. This may make it difficult to transfer or handle the film easily. An upper limit of the tension modulus is preferably equal to or less than 10 GPa, and more preferably, equal to or less than 9.0 GPa. With a tension modulus more than the above-mentioned value, the stiffness of the film become too high. This may result in difficulty in handling. A value of the tension modulus is increased by increase in a ratio of a rigid diamine, a rigid acid dianhydride, or 3,4'-diaminodiphenyl ether. On the contrary, the value is decreased by decrease in the ratio.

In consideration of an influence on the dimensional changes, when the polyimide film is kept at 80% R.H. for three hours after kept at 40% R.H. at 50° C. for three hours, it is preferable to have a moisture expansion coefficient equal to or less than 13 ppm/° C. It is more preferable to have the moisture expansion coefficient equal to or less than 11 ppm/° C. When the moisture expansion coefficient is more than the above-mentioned value, dimensional changes largely depends on environment. Accordingly, a problem may arise when the polyimide film is used for FPCs. The moisture expansion coefficient tends to become large when a ratio of a polar group such as an ether group or carbonyl group increase in a polyimide molecular chain. The moisture expansion coefficient also tends to become large when a diamine component and an acid dianhydride component, which have small molecular mass, is used (number of imide groups per molecular mass unit increases). Therefore, the moisture expansion coefficient can be controllable by control of a ratio of a flexible component used and selection of a monomer structure (molecular mass).

In consideration of an influence on the dimensional changes further, it is preferable that a linear expansion coefficient of the polyimide film in a range of 100 to 200° C. be equal to or less than 15 ppm/° C. It is more preferable that the linear expansion coefficient be equal to or less than 13 ppm/° C. When the linear expansion coefficient is larger than the above-mentioned value, the linear expansion coefficient of an adhesive film made of the polyimide film becomes too large and has a large difference from the linear expansion coefficient of a metal foil. This results in the dimensional changes. When, on the contrary, the linear expansion coefficient is too small, the linear expansion coefficient of the polyimide film also becomes largely different from the linear expansion coefficient of the metal foil. Therefore, it is preferable that a lower limit of the linear expansion coefficient of the polyimide film be 5 ppm/° C. It is more preferable that the lower limit be 6 ppm/° C. If the linear expansion coefficient of the polyimide film is in a range of 5 to 15 ppm/° C., and more preferably, in a range of 6 to 13 ppm/° C., it becomes easy to have a linear expansion coefficient of the adhesive film close to that of the metal foil. As mentioned above, the linear expansion coefficient of the polyimide film can be controlled by a mixing ratio of a flexible component and a rigid component.

Any solvent that dissolves the polyamic acid may be used in the synthesis of the polyamic acid. Preferable examples of the solvent include amide solvents such as N,N-dimethylformamide, N,N-dimethylacetamide, and N-methyl-2-pyrrolidone. N,N-dimethylformamide and N,N-dimethylacetamide are particularly preferable.

A filler may be added to improve various properties of the film, such as slidability, thermal conductivity, electrical conductivity, corona resistance, and loop stiffness. The filler may be any but preferably silica, titanium oxide, alumina, silicon nitride, boron nitride, calcium hydrogen phosphate, calcium phosphate, or mica.

The diameter of the filler particles may be determined based on the film properties to be modified and the type of filler, and is thus not particularly limited. The average particle diameter is usually 0.05 to 100 µm, preferably 0.1 to 75 µm, more preferably 0.1 to 50 µm, and most preferably 0.1 to 25 µm. When the average diameter is below this range, the effect of modification is not readily exhibited. At an average diameter beyond this range, the surface properties and/or the mechanical properties may be significantly degraded. The amount of the filler to be added is determined based on the film properties to be modified and the diameter of the filler particles and is thus not particularly limited. The amount of the filler added is usually 0.01 to 100 parts by weight, preferably 0.01 to 90 parts by weight, and more preferably 0.02 to 80 parts by weight per 100 parts by weight of polyimide. At a filler content below this range, the effect of the modification by the use of the filler may not be sufficiently exhibited. At a filler content beyond this range, the mechanical properties of the film may be significantly degraded. The filler may be added by any method. The examples of the method include:

1. Method of adding the filler to the polymerization solution before or during the polymerization;
2. Method of adding and kneading the filler into the polymerization solution with a three-shaft roller after completion of the polymerization; and
3. Method including preparing a dispersion containing the filler in advance and adding the dispersion into a polyamic acid organic solvent solution.

It is preferable to employ the method including preparing a dispersion containing the filler in advance and adding the dispersion into a polyamic acid organic solvent solution, in particular, a method including preparing a dispersion containing the filler in advance and adding the dispersion into a polyamic acid organic solvent solution immediately before the film forming since contamination of the manufacturing line by the filler is least. In preparing the filler-containing dispersion, the same solvent as the polymerization solvent for the polyamic acid is preferably used. In order to sufficiently disperse the filler and stabilize the dispersion state, a dispersant, a thickener, or the like may be used in amounts that do not adversely affect the properties of the film.

A known process may be employed to produce a polyimide film from the polyamic acid solution. In particular, a thermal imidization process and a chemical imidization process are available. The thermal imidization process precedes the imidization only by heat application without using a dehydrating agent or the like. In the chemical imidization process, the imidization is promoted by reacting the polyamic acid with the dehydrating agent and/or an imidization catalyst.

The dehydrating agent is a dehydrating ring-closing agent for the polyamic acid. Examples of the dehydrating agent are an aliphatic acid anhydride, an aromatic acid anhydride, N,N'-dialkylcarbodimide, a lower aliphatic halide, a halogenated lower aliphatic acid anhydride, aryl phosphonic acid dihalide, thionyl halide, or a mixture of two or more of them. Of these compounds, an aliphatic acid anhydride such as an acetic anhydride, a propionic anhydride, and a butyric anhydride, or a mixture of two or more of them are preferable as the dehydrating agent in view of availability and cost.

The imidization catalyst is a catalyst having a component that encourages a dehydrating ring-closing process of the polyamic acid. Examples of the imidization catalyst are aliphatic tertiary amines, aromatic tertiary amines, and heterocyclic tertiary amines. Of these compounds, heterocyclic tertiary amines are especially preferable in view of reactivity as an imidization catalyst. Specifically, quinoline, isoquinoline, β-picoline, pyridine and, etc. are preferably used.

Either process may be used to produce the film; however, the chemical imidization process tends to produce a polyimide film having various properties preferred in the present invention.

The process for producing a polyimide film particularly preferred in the present invention preferably includes the steps of:

a) reacting an aromatic diamine and an aromatic tetracarboxylic dianhydride in an organic solvent to yield a polyamic acid solution;

b) flow-casting a film-forming dope containing the polyamic acid solution onto a support;

c) heating the cast dope on the support and peeling off the resulting gel film from the support; and d) further heating and drying the gel film to imidize the remaining amic acid.

(Method for Producing Polyimide Film)

A process for producing a polyimide film according to a preferred embodiment of the present invention, which is a chemical imidization process, will now be described as an example. It should be understood that the invention is not limited by the examples below.

The film-forming conditions and heating conditions vary depending on the type of polyamic acid, the thickness of the film, and the like.

A dehydrator and an imidization catalyst are mixed in a polyamic acid solution at low temperature to prepare a film-forming dope. The film-forming dope is then cast into a film-like shape onto a support, such as a glass plate, an aluminum foil, an endless stainless steel belt, or an stainless steel drum, and the film-forming dope is heated at 80° C. to 200° C., preferably at 100° C. to 180° C. to activate the dehydrator and the imidization catalyst. The resulting film thereby partly cured and/or dried is then peeled from the support to obtain a polyamic acid film (hereinafter referred to as "gel film").

The gel film is in the intermediate stage of baking the polyamic acid to a polyimide and has a self-supporting ability. The volatile content in the gel film determined by the following Equation (2) is usually 5 to 500 percent by weight, preferably 5 to 200 percent by weight, and more preferably 5 to 150 percent by weight:

$$(A-B) \times 100/B \tag{2}$$

where A is the weight of the gel film, and B is the weight of the gel film after 20 minutes of heating at 450° C. A film satisfying this range is preferably used; otherwise, problems such as film breaking during the baking step, uneven color tone due to uneven drying, variations in characteristics, and the like may occur.

The amount of the dehydrator used is preferably 0.5 to 5 mol and more preferably 1.0 to 4 mol per mole of the amic acid unit in the polyamic acid.

The amount of the imidization catalyst is 0.05 to 3 mol and preferably 0.2 to 2 mol per mole of the amic acid unit in the polyamic acid.

When the content of the dehydrator and the imidization catalyst is below this range, chemical imidization proceeds insufficiently. Thus, breaking of the film may occur during the baking, or mechanical strength may be reduced. When the content is beyond this range, the progress of imidization is excessively accelerated, and it may be difficult to satisfactorily cast the solution into a form of film.

A polyimide film of the present invention is obtained by drying the gel film held at its edges so as to dry the film without shrinkage that may occur during the baking. This drying removes water, the residual solvent, the residual dehydrating agent, and the imidization catalyst from the film. Then, the residual amic acid is completely imidized to give a polyimide film of the present invention.

Here, it is preferable to finally heat the film at a temperature in a range of 400° C. to 650° C. for 5 to 400 seconds. If the temperature is over this range and/or if the heating time is beyond this range, heat deterioration of the film may occur. In contrast, if the temperature is below this range and/or if the heating time is below this range, expected effects may not be exhibited.

In order to reduce the internal stress remaining in the film, it is possible to heat the film under the minimum tension necessary for film transfer. The heating process may be conducted in the film-forming process; alternatively, a separate heating process may be provided. The heating conditions vary depending on the properties of the film or the device used. Although no general limitation can be introduced, the temperature of the heating process is usually in the range of 200° C. to 500° C., preferably 250° C. to 500° C., and most preferably 300° C. to 450° C. and the heating time is usually 1 to 300 seconds, preferably 2 to 250 seconds, and most preferably about 5 to 200 seconds, for reducing the internal stress.

According to the present invention, it is preferable that the polyimide film have a molecular orientation in a direction of the film transfer (MD direction) in order to cancel an effect of tension and stretch from lamination, when the film is finally processed with the thermal laminating method. In other words, it is preferable that an angle of the molecular orientation axis be in a range of −15 to 15° to the MD direction. A following method, which is preferably employed, is one example of controlling the angle of the film molecular orientation axis.

The method is an organic insulating film production method at least including the steps of:

(A) polymerizing to form a polyamic acid;

(B) flow-casting and spreading a composition containing the polyamic acid and an organic solvent onto a support and forming a gel film;

(C) peeling off the resulting gel film from the support and holding the gel film at its edges; and (D) transferring the film held at its edges in a heating furnace, wherein the step (D) at least includes the step of (D-1) transferring the film held in a manner such that the film has substantially no tension in a film width direction (TD direction) in at least part of the step (D).

In the step (A), the polyamic acid is prepared by polymerization with the process mentioned-above.

In the step (B), the composition containing the polyamic acid and the organic solvent (i.e. polyamic acid solution) is flow-cast and spread onto the support and the gel film is formed. The gel film should be obtained as mentioned above. In the step (B), the volatile content in the gel film is preferably equal to or less than 500 percent by weight, more preferably 25 to 200 percent by weight, and most preferably 30 to 150 percent by weight.

In the step (C), the gel film is peeled off from the support and continuously held so that the edges of the gel film are held. This step may employ a conventionally known process such as holding the edges with a clip or by pinning. As one method of holding the film in a manner such that the film has substantially no tension in the TD direction in the step (D) in at least part of the step (D), the gel film may be held so that the film has substantially no tension in the TD direction when the edges of the gel film is held in this step (C). This is a method which transfers to the step (D) the film held in the step (C) in a manner such that the film has substantially no tension in the TD direction. Specifically, when the film is held at its edges, the film is held loosely.

In the step (D), the film held at its edges is transferred in the heating furnace. In the present invention, it is preferable, in view of obtaining an organic insulating film having a molecular orientation controlled in the MD direction, to include, as at least a part of the step (D), the step (D-1) of transferring the film held in a manner such that the film has substantially no tension in the film width direction (TD direction).

The description that the film has substantially no tension in the TD direction means that, other than tension due to the film's own weight, no tension due to mechanical handling is not applied to the film in the TD direction. Substantially, the description means that the film width (See 8 in FIG. 1) between the held end sections of the film is longer than a distance between the held end sections of the film (See 7 in FIG. 1) in a straight line. The film in such a state is described as the film that has substantially no tension. The film in the state is now explained with reference to FIG. 1. The film is held by a film holding device. A length indicated by Reference 7 in FIG. 1 is a distance between edges of the end sections holding device 1. End sections of the film are usually in a state where tense tension is applied. In such a case, the film width 8 between the held end sections of the film is the same as the distance 7 between the held end sections of the film. However, in the present invention, as illustrated in FIG. 1, the film width 8 is different from the distance 7 between the held end sections of the film, and the distance 7 is shorter than the film width 8. Specifically, the film is loosely held. In view of controllability of the molecular orientation of the film in the MD direction, it is preferable that the film be held so as to satisfy X and Y in the following Equation (3):

$$20.0 \geq (Y-X)/Y \times 100 > 0.00 \tag{3}$$

where X is the distance 7 between the held end sections of the film and Y is the film width 8 between the held end sections of the film. (Y−X)/Y ×100(Hereinafter, referred to as a TD shrinkage ratio for convenience) beyond the above-mentioned range makes it difficult to stably control the extent of the looseness of the film. Therefore, the extent of the looseness of the film may change along the method in which the film is transferred. In some case, the film falls from the end sections holding device due to the looseness of the film and a steady film production may become impossible. A more preferable TD shrinkage ratio is 15.0 >(Y−X)/Y ×100>0.00. An especially preferable TD shrinkage ratio is 10.0 >(Y−X)/Y ×100>0.00.

In the present invention, in order to produce the film so that the molecular orientation axis in all film width becomes along the MD direction, it is preferable that the film be held to have substantially no tension in the TD direction at entering the heating furnace. In order to transfer the film in a manner such that the film is held to have substantially no tension in the TD direction at entering the heating furnace, there are two methods raised as examples here. In one method (method 1), the step (D) is fed with the film held to have substantially no tension in the TD direction in the above-explained step (C) for holding the end sections of the gel film. In the other method (method 2) other than the method 1, the film is manipulated to reduce the distance between the held end sections of the film after the step (C) and then sent to the step (D). In the method 1, it is preferable that the film be held so as to satisfy Equation (3) when the gel film is held. In the method 2, it is preferable that the distance between the held edges be reduced so as to satisfy Equation (3).

It is also possible to manipulate the film in order to reduce the distance between the held end sections of the film after the film has been transferred into the heating furnace in the step (D) (method 3). A combination of two or more of these methods is also possible. In the method 3, it is preferable to manipulate the film in order to reduce the distance between the held end sections of the film in a temperature range of equal to or less than 300° C., more preferably, equal to or less than 250° C., and, most preferably, equal to or less than 200° C. When the manipulation in the method 3 is carried out in the temperature range beyond 300° C., control of the molecular orientation of the film tends to become difficult, especially at the end sections of the film.

In the step (D), the film shrinks to a certain extent because the film is heated rapidly and drastically. Accordingly, when the film held to have substantially no tension in the TD direction enters in the heating furnace, the heat shrinks the film thereby decreasing the film width. As a result, the distance between the held end sections of the film becomes the same as the length of the film width between the held end sections of the film, and film with no wrinkle can be produced.

A furnace preferably used for the present invention is an air heating furnace that heats the film by emitting air (heated to equal to or more than 100° C.) onto an entire film from an upper surface side, a bottom surface side or both of the upper and bottom surface sides of the film, or a far-infrared furnace that includes a far-infrared ray generating device emitting a far-infrared ray onto the film to bake the film. It is preferable to bake the film by stepwisely increasing the temperature of the heat in the heating process. In order to realize such heating process, it is preferable to employ a heating furnace baking the film stepwisely by combining a plurality of furnaces including an air heating furnace, a far-infrared furnace, or a combination thereof. It is also preferable that the heating furnace include a device between adjacent furnaces for forming a barrier which prevents heat of a precedent furnace from being transmitted to a subsequent furnace.

In the above-mentioned baking process of the present invention, it is preferable that heat firstly applied on the gel film held and transmitted into the heating furnace is at a temperature in a range of 100 to 250° C. It is more preferable that the heat be at a temperature in a range of 120 to 200° C. This makes it easier to obtain an organic insulating film whose molecular orientation is controlled in the MD direction. Specifically, it is preferable to arrange the above-mentioned heating furnace to includes two or more heating furnaces, among which a temperature in a first heating furnace is in a range of 100 to 250° C. In particular, it is desirable to examine a boiling temperature of a solvent in the gel film and control the temperature of the first heating furnace in a range of a temperature 100° C. lower than the boiling temperature to a temperature 100° C. higher than the boiling temperature.

A bowing phenomenon occurs in the polyimide film production where the heating temperature firstly applied on the film transferred into the furnace is equal to or more than 250° C. The bowing phenomenon is a phenomenon having strong molecular orientation at end sections of the film because a center section of the film is transferred into the heating furnace at a faster rate than the end sections of the film due to an effect of the film shrinkage. On the contrary, in case where the heating temperature firstly applied is equal to or less than 100° C., the temperature of the subsequent furnace may be set in a range of 100° C. to 250° C. This makes it possible to produce of the polyimide film whose molecular orientation axis is controlled. It is preferable to set the heating temperature firstly applied and the temperature of the subsequent furnace as mentioned above. However, the baking of the film is preferably programmed such that baking temperatures other than the above-mentioned temperatures be such temperatures usually adopted in production of a general polyimide film. For example, it is preferable that the film be baked at temperatures stepwisely increasing up to 600° C. When the maximum baking temperature is low, it becomes necessary to bake the film sufficiently because imidization rate may not be enough.

The tension applied in the MD direction on the gel film transferred into the heating furnace is preferably applied at a range of 1 to 20 kg/m, and especially preferably at a range of 1 to 15 kg/m. When the tension is equal to or less than 1 kg/m, it is difficult to transfer the film steadily. Accordingly, it becomes difficult to perform such a film production with the film held stably. On the contrary, when the tension applied on the film is equal to or more than 20 kg/m, it tends to become difficult to control the molecular orientation in the MD direction, in particular, at the end sections of the film. The tension generating device providing tension onto the gel film transferred in to the furnace may employ various methods for controlling the tension applied onto the gel film. Examples of such method is a method using a load roll applying load onto the gel film, a roll changing the load by controlling a rotation speed of the load roll, and nip rolls controlling tension by pinching the gel film between the two rolls.

It is preferable to appropriately control the tension applied onto the film in the above-mentioned range in accordance with thickness of the polyimide film. Preferable film thickness is in a range of 1 to 200 μm. Especially preferable thickness of the film is in a range of 1 to 100 μm.

The polyimide film obtained by the above-mentioned heating process has polyimide molecules directed into the MD direction. An angle (θ) of the molecular orientation axis to the MD direction of the film is not necessarily limited. However, it is preferable that the angle be in a range $-15° \leq \theta \leq 15°$. When the angle θ of the molecular orientation axis to the MD direction of the film is out of the above-mentioned range, the orientation may be insufficient. Accordingly, in such a case, the film may not easily exhibit the effect of suppressing the dimensional changes. It is preferable that the angle θ of the molecular orientation axis to the MD direction of the film be in the range $-15° \leq \theta \leq 15°$ so that the film sufficiently exhibits the effect of suppressing the dimensional changes. It is more preferable that the angle θ be in a range of $-10° \leq \theta \leq 10°$. It is the most preferable that the angle θ be in a range of $-5° \leq \theta \leq 5°$. The above-mentioned angle of the molecular orientation axis indicates an angle between an reference axis and the orientation axis of the polyimide molecular chain; for example, when the angle θ of the molecular orientation axis to the film MD direction is 0°, the molecular orientation axis is in the film MD direction.

The above-mentioned heating process also changes a linear expansion coefficient of the polyimide film obtained. It is preferable that ranges of the linear expansion coefficients be $2 \leq \beta_1 \leq 10$, $5 \leq \beta_2 \leq 25$, and $10 \leq (\beta_1 + \beta_2) \leq 40$, where $\beta_1$ (ppm/° C.) is a linear expansion coefficient (at 200 to 300° C.) of the polyimide film in the MD direction and $\beta_2$ (ppm/° C.) is a linear expansion coefficient (at 200 to 300° C.) of the polyimide film in the TD direction. When the values of $\beta_1$ and $\beta_2$ are out of the above-mentioned range, for example, an influence of the tension at the thermal laminating process may not be sufficiently eliminated. Therefore, the effect of suppressing the dimensional changes may be small. Moreover, when the values of $\beta_1$ and $\beta_2$ are out of the above-mentioned range, a molecular orientation in a film thickness direction (z axis direction) is on occasion changed drastically. As a result, the film may not exhibit the effect of suppressing the dimensional changes and other physical properties of the film may deteriorate.

Examples preferably used as the thermoplastic polyimide contained in the adhesive layer of the adhesive film of the present invention are thermoplastic polyimide, thermoplastic polyamide-imide, thermoplastic polyetherimide, and thermoplastic polyester-imide. Among these thermoplastic polyimides, in view of low moisture absorption property, especially thermoplastic polyester-imide is preferably used.

It is preferable that the thermoplastic polyimide of the present invention have a glass transition temperature (Tg) in a range of 150 to 300° C., in consideration of a temperature that makes the lamination by a present laminating apparatus possible and does not damage a heat resistance of the metal-clad laminate obtained. Moreover, further taking the solder resistance after moisture absorption into consideration, it is preferable that Tg be equal to or more than 230° C. It is more preferable that Tg be equal to or more than 240° C. Tg can be calculated out from a value of an inflection point of a storage modulus measured by a dynamic viscoelasticity measuring apparatus (DMA (Dynamic Mechanical Analysis)).

Polyamic acid as a precursor of thermoplastic polyimide is not specifically limited, and any polyamic acid can be used. The polyamic acid may be produced by using conventionally known raw material, reaction condition, and the like (For example, refer to an embodiment later explained). An inorganic or organic filler may be added, if necessary.

(Adhesive Film)

An adhesive film of the present invention can be obtained by providing an adhesive layer containing a thermoplastic polyimide on at least one surface of the polyimide film. A suitable example of a production method of the adhesive film is a method in which an adhesive layer is formed on the polyimide film as a base material film, or a method in which a sheet adhesive layer is formed and then adhered to the base material film. When the former method is employed, complete imidization of the polyamic acid, which is a precursor of thermoplastic polyimide, contained in the adhesive layer may deteriorate solubility of the polyamic acid in an organic solvent. As a result, it may be difficult to provide the above-mentioned adhesive layer onto the base material film. Accordingly, in view of this problem, it is preferable to employ a procedure including steps of (i) preparing a solution containing a polyamic acid that is a precursor of thermoplastic polyimide, (ii) applying the solution onto the base material film, and (iii) then imidizing the solution. This imidization may be carried out by either a thermal curing method or a chemical curing method.

In view of an efficient imidization in employing any of the imidization methods, it is preferable that the temperature for the imidization be set in a range of (a glass transition temperature of the thermoplastic polyimide −100° C.) to (the glass transition temperature of the thermoplastic polyimide +200° C.). It is more preferable to set the temperature in a range of (the glass transition temperature of the thermoplastic polyimide −50° C.) to (the glass transition temperature of the thermoplastic polyimide +150° C.). The higher the thermal curing temperature occurs, the more easily the imidization proceeds and the faster curing speed becomes. Therefore, a higher thermal curing temperature is preferable in view of productivity. However, when the thermal curing temperature is too high, thermal decomposition of the thermoplastic polyimide may occur. On the contrary, when the thermal curing temperature is too low, the imidization becomes difficult to proceed, and time necessary for the curing becomes longer.

Imidization time is not limited uniquely if the time is long enough to substantially complete the imidization and drying. However, the imidization time is appropriately set in a range of 1 to 600 seconds. In order to improve melting fluidity of the adhesive layer, it is possible to intentionally set a low imidization rate and/or leave residual solvent.

It is preferable to set the tension applied in the imidization is in a range of 1 to 15 kg/m. It is more preferable that the imidization be in a range of 5 to 10 kg/m. When the tension is smaller than the above-mentioned range, a problem may arise; the problem is such that, for example, the film is loosened during transfer of the film and cannot be wound uniformly. On the contrary, when the tension is beyond the above-mentioned range, the adhesive film under a strong tension is heated to a high temperature. Consequently, heat stress is applied to the adhesive film even if a core film having a high tensile modulus or a core film in which molecules are directed in the MD direction is used. This may result in the dimensional changes.

A method of casting and spreading the polyamic acid solution on the base material film is not specifically limited and can employ a conventional method such as a die coater, a reverse coater, or a blade coater. The polyamic acid solution may contain another material such as a filler, according to usage.

Thickness of each layer of the adhesive film should be appropriately controlled so that total thickness of the adhesive layer is suitable for usage of the adhesive film. However, in view of suppressing occurrence of distortion due to heat during the thermal lamination, it is preferable to set the thermal expansion coefficient of the adhesive film so that the thermal expansion coefficient of the adhesive film at a temperature in a range of 200 to 300° C. becomes close to that of the metal foil. Specifically, it is preferable that the thermal expansion coefficient of the adhesive film be set to equal to or ±10 ppm less than that of the metal foil. It is more preferable that the thermal expansion coefficient of the adhesive film be set to equal to or ±5 ppm less than that of the metal foil.

Moreover, according to the usage of the adhesive film, a various surface treatment such as a corona treatment, a plasma treatment, or a coupling treatment may be performed onto a surface of the core film before or after the adhesive layer is provided.

(Flexible Metal-Clad Laminate)

The flexible metal-clad laminate of the present invention can be obtained by adhering a metal foil on the adhesive film. The metal foil used is not specifically limited. For example, the flexible metal-clad laminate of the present invention used in an electronics device or electronic equipment may employ a metal foil made of copper, copper alloy, stainless steel, stainless steel alloy, nickel, nickel alloy (including 42 metal alloy), aluminum, or aluminum alloy. A general flexible metal-clad laminate often employs copper foils such as a rolled copper foil or an electrolytic copper foil. Such foils are also preferably used in the present invention. Moreover, a rustproof layer, a heat resisting layer, or an adhesive layer may be applied on a surface of each of the metal foils.

In the present invention, thickness of the metal foil is not specifically limited. The metal foil may have any thickness if the metal foil can function sufficiently according to usage. An example of a method usable for adhering the adhesive film and the metal foil is a continuous processing by a thermal roll laminating apparatus (which includes one or more pair of metal rollers) or a double belt press (DBP) apparatus. Among the apparatuses, it is preferable to use the heat roll laminating apparatus including one or more pair of metal rollers, in view of an advantage in maintenance cost because of a simple arrangement of the apparatus. The dimensional changes easily occur especially when the adhesive film is adhered to the metal foil by the thermal laminating apparatus including one or more pairs of metal rollers. Accordingly, the polyimide film and the adhesive film according to the present invention exhibit a remarkable effect when each of the polyimide film and the adhesive film is adhered to the metal foil by the thermal laminating apparatus. The "thermal laminating apparatus including one or more pairs of metal rollers" described here may be any apparatus including metal rollers for pressing a material with heat and an arrangement of the "thermal laminating apparatus including one or more pairs of metal rollers" is not specifically limited.

A specific arrangement of means for carrying out the above-mentioned thermal lamination is not specifically limited. However, in order to obtain a good appearance of the laminate obtained, it is preferable to provide a protective material between a pressed surface and the metal foil. The protective material is a material that can resist a heating temperature of the thermal laminating process. Examples of such a protective material are heat-resisting plastic such as a non-thermoplastic polyimide film, and a metal foil such as a copper foil, an aluminum foil, or a SUS foil. Among these materials, in view of an excellent balance of heat resistance, reusability and the like, it is preferable to use a non-thermoplastic polyimide film, or a film made of a thermoplastic polyimide that has a Tg temperature that is higher than a laminating temperature by 50° C. or more. Moreover, if the thickness is thin, the non-thermoplastic polyimide film cannot sufficiently perform buffering function or protective function during the lamination. Therefore, it is preferable that the thickness of the non-thermoplastic polyimide film be equal to or more than 75μm.

This protective material does not need to be one layer, and may have a multi-layer structure including equal to or more than two layers having respectively different properties.

If an unprocessed protective material is employed for the lamination using a high laminating temperature, the appearance and the dimensional stability of the flexible metal-clad laminate obtained may not become sufficient due to a sudden thermal expansion. Accordingly, it is preferable to preliminarily heat the protective material before the lamination. An example of means for the preliminary heating is a method of feeding the protective material to the heating roller in such a manner that the protective material is in touch with the heating roller by, for example, running the protective material along the heating roller longer. It is preferable that the protective material be in contact with the heating roller for equal to or more than one second. It is more preferable that the protective material be in contact with the heating roller for equal to or more than three seconds. By preliminarily heating the protective material, thermal expansion of the protective material will be completed before the lamination. Accordingly, it is possible to prevent that the thermal expansion influences the appearance and the dimensional property of the flexible metal-clad laminate. When the protective material is in contact with the heating roller for shorter than the above-mentioned time, the lamination is carried out before the thermal expansion of the protective material has not been completed. As a result, the appearance and the dimensional property of the flexible metal-clad laminate obtained may deteriorate due to the sudden thermal expansion of the protective material during the lamination. There is no particular limitation as to a length of the touching of the protective material to the heating roller. The length of the touching may be appropriately adjusted, depending on a diameter of the heating roller and the above-mentioned period during which the protective material is in contact with the heating roller.

The protective material is separated at a stage (after post-lamination cooling) where the protective material is cooled down after the lamination. Right after the lamination, the protective material and a laminating materials are soften due to the high temperature. Accordingly, if the protective material is separated right after the lamination, the laminating materials may be applied with a removing stress, whereby the dimensional stability is deteriorated. Moreover, if the protective material is separated when the protective material and the laminating materials are still at a high temperature, the laminating materials may not be prevented from moving and the appearance of the laminating materials may deteriorate due to shrinkage caused by cooling down. Accordingly, it is preferable that the protective material be separated after the laminating materials is cooled down to a temperature that is lower than the glass transition temperature of the adhesive film by 100° C. or more. It is more preferable that the protective material be separated after the laminating materials is cooled down to a room temperature.

A heating method of the laminating materials in the above-mentioned thermal laminating means is not specifically limited. Heating means employing a conventionally known method can be used if the method can apply heat at a predetermined temperature. Examples of such a method are a thermal circulation method, a hot-air heating method, and an induction heating method. Similarly, a method of applying pressure to the laminating materials in the above-mentioned thermal laminating means is also not specifically limited. Pressure application means employing a conventionally known method can be used if the method can apply a predetermined pressure. Examples of such a method encompass a hydraulic method, an air pressure method, and a gap pressure method.

It is preferable that a heating temperature, namely, a laminating temperature, in the above-mentioned thermal laminating process be equal to or more than a glass transition temperature (Tg) of an adhesive film +50° C. It is more preferable that the heating temperature be equal to or more than Tg+100° C. If the temperature is equal to or more than Tg+50° C., the thermal lamination of the adhesive film and the metal foil can be favorably carried out. If the temperature is equal to or more than Tg+100° C., it is possible to increase speed of the lamination and to improve the productivity of the lamination. Especially, the polyimide film used as a core of an adhesive film of the present invention is designed so as to effectively alleviate the heat stress when the polyimide film is used in the lamination at a temperature equal to or more than Tg+100° C. Accordingly, if the temperature is equal to or more than Tg+100° C., it is possible to efficiently obtain a flexible metal-clad laminate whose dimensional stability is excellent.

Now, explained below is a heat stress alleviation mechanism during the thermal lamination. When an adhesive layer of the adhesive film contains a thermoplastic polyimide, a laminating temperature inevitably becomes high. Consequently, the temperature of the flexible metal-clad laminate also becomes high to a great extent right after the lamination. If the storage modulus of a core layer of the adhesive film is decreased to a value less than a specific level, an entire adhesive film is softened together with the adhesive layer (but, the adhesive film keeps the self-supporting ability.). In such an adhesive film, alleviation occurs in the heat stress, which is stored in the laminate by applied tension and pressure during the thermal lamination.

In order to alleviate the heat stress more efficiently, it is preferable to minimize the tension applied on the laminate. Accordingly, it is preferable (i) to bring the flexible metal-clad laminate, which still includes the protective material, into contact with the heating roller right after the lamination in a manner such that, for example, the flexible metal-clad laminate is fed to the heating roller in such a manner that the flexible metal-clad laminate is run along the heating roller longer, (ii) to alleviate residual distortion that has occurred during the thermal lamination in a state that the flexible metal-clad laminate is not be influenced by the tension and, then, (iii) to remove the flexible metal-clad laminate from the heating roller. It is preferable that time during which the flexible metal-clad laminate be in contact with the heating roller is equal to or more than 0.1 second. It is more preferable that time during which the flexible metal-clad laminate be in contact with the heating roller is equal to or more than 0.2 second. It is especially preferable that time during which the flexible metal-clad laminate be in contact with the heating roller is equal to or more than 0.5 second. When the flexible metal-clad laminate contacts the heating roller for the time shorter than the above-mentioned range, an alleviation effect may not sufficiently occur. It is preferable that an upper limit of the time during which the flexible metal-clad laminate be in contact with the heating roller is equal to or less than 5 seconds. Contact for equal to or more than 5 seconds does not improve the alleviation effect exhibited, and also causes deterioration in the laminating speed and constraint in production line. Therefore, the upper limit equal to or more than 5 seconds is not preferable.

Even if the flexible metal-clad laminate after the lamination is put in contact with the heating roller and gradually cooled, difference between the temperature of the flexible metal-clad laminate and the room temperature may still be large and the residual distortion may not be sufficiently alleviated. Therefore, it is preferable that the flexible metal-clad laminate after being in contact with the heating roller and gradually cooled be subjected to a subsequent heating process with the protective material still on the flexible metal-clad laminate. At the subsequent heating process, it is preferable that tension of the flexible metal-clad laminate be in a range of 1 to 10 N/cm. Moreover, it is preferable that an atmosphere temperature of the subsequent heating be in a range of (a laminating temperature −200° C.) to (a laminating temperature +100° C.). The description "atmosphere temperature" here means an outer surface temperature of protective material adhering to both sides of the flexible metal-clad laminate. An actual temperature of the flexible metal-clad laminate changes a little depending on thickness of the protective material. However, if the temperature on the surface of the protective material is set in the above-mentioned range, it becomes possible that the flexible metal-clad laminate exhibits an effect of the subsequent heating. The measurement of the outer surface temperature of the protective material can be carried out by using a thermocouple, a thermometer, or the like.

In the above-mentioned laminating process, it is preferable that the laminating speed be equal to or more than 0.5 m/min. It is more preferable that the laminating speed be equal to or more than 1.0 m/min. The laminating speed equal to or more than 0.5 m/min allows a sufficient thermal lamination, and the laminating speed equal to or more than 1.0 m/min makes it possible to improve productivity further.

A higher pressure in the above-mentioned thermal laminating process, namely, a higher laminating pressure is advantageous in that the laminating temperature can be kept low and the laminating speed can become faster. However, generally, when the laminating pressure is too high, the laminate obtained is prone to deterioration in dimensional changes. On the contrary, when the laminating pressure is too low, the metal foil is adhered to the laminate obtained with a low bonding strength. Therefore, it is preferable that the laminating pressure be in a range of 49 to 490 N/cm (5 to 50 kgf/cm). It is more preferable that the laminating pressure be in a range of 98 to 294N/cm (10 to 30 kgf/cm). The laminating pressure in this range makes it possible to have three favorable conditions, which are the laminating temperature, the laminating speed, and the laminating pressure. Thereby, it is possible to further improve the productivity.

A preferable adhesive film tension in the above-mentioned laminating process is in a range of 0.01 to 4N/cm. A more preferable adhesive film tension is in a range of 0.02 to 2.5 N/cm. The most preferable adhesive film tension is in a range of 0.05 to 1.5 N/cm. The tension below the above-mentioned range may cause the laminate loosened or meandering when the laminate is transferred. As a result, it may become difficult to obtain a flexible metal-clad laminate having a favorable appearance, because the laminate cannot be fed to the heating roller evenly. On the contrary, when the tension is beyond the above-mentioned range, the influence of the tension becomes too strong to be alleviated by control of the Tg and the storage modulus of the adhesive layer. This may result in deterioration of the dimensional stability.

In order to obtain the flexible metal-clad laminate of the present invention, it is preferable to use a thermal laminating apparatus continuously adhering a laminating materials by application of heat and pressure. This thermal laminating apparatus may include, as a preliminary step to the thermal lamination means, laminating material feeding means that unrolls a rolled laminating material to be fed in for the thermal lamination. Moreover, the thermal laminating apparatus also may include, as a subsequent step to the thermal lamination means, laminating material winding means for winding the laminating materials. By providing these means, it is possible to further improve productivity of the above-mentioned thermal laminating apparatus. Arrangements of the above-mentioned laminating material feeding means and laminating material winding means are not specifically limited. One example of the above-mentioned laminating material feeding means and laminating material winding means is a publicly known roll winding apparatus capable of winding an adhesive film, a metal foil, or a laminate obtained.

Furthermore, it is more preferable to include protective material winding means and protective material feeding means that winds and unrolls the protective material. The protective material winding means and protective material feeding means, if provided, make it possible to reuse the protective material by winding the protective material that has been used once in the thermal laminating process and reset the protective material thus wound to the feeding means. Moreover, end position detecting means and winding position correcting means may be provided so as to align end sections of the protective material wound when the protective material is wound. This makes it possible to wind the protective material in a manner such that the end sections of the protective material is precisely aligned. This makes it possible to increase efficiency in reusing the protective material. There is no specific limitation in arrangements of the protective material winding means, the protective material feeding means, the end position detecting means, and the winding position correcting means. Conventionally known various devices may be employed as the protective material winding means, the protective material feeding means, the protective material feeding means, the end position detecting means, or the winding position correcting means.

In the flexible metal-clad laminate obtained in the production method of the present invention, it is very preferable that a dimensional change ratio before and after heating (at 250° C. for 30 minutes) after removal of the metal foil be in a range of the −0.04 to +0.04% in both of the MD direction and the TD direction. The dimensional change ratio before and after the heating is expressed by a ratio of (i) difference between a predetermined dimension of the flexible metal-clad laminate after etching process and a predetermined dimension thereof after the heating process to (ii) a predetermined dimension thereof before the heating process.

The dimensional change ratio out of this range may result in a large dimensional change of the flexible metal-clad laminate in mounting elements. Consequently, the large dimensional change would shift wires from positions to which the elements are to be mounted according to design, thereby failing to connect the elements with the substrate sufficiently. In other words, it is possible to consider that the dimensional change ratio in the above-mentioned range will not cause any trouble in mounting the elements.

A method of measuring the above-mentioned dimensional change ratio is not specifically limited. Any conventionally known method can be used if dimensional increase/decrease of the flexible metal-clad laminate before and after the etching or the heating process can be measured.

It is essential to measure the dimensional change ratios in both of the MD direction and the TD direction. When imidization and lamination are carried out continuously, tension applied in the MD direction is different from tension applied in the TD direction. Accordingly, a degree of thermal expansion/shrinkage in the MD direction is different from a degree of thermal expansion/shrinkage in the TD direction. Consequently, the dimensional change ratios in the MD direction and the TD direction also become different to each other.

Therefore, a material whose dimensional change is small is required to have small dimensional change ratios in both of the MD direction and the TD direction. In the present invention, it is very preferable that values of the dimensional change ratios before and after the heating at 250° C. for 30 minutes after removal of the metal foil be in a range of −0.04 to +0.04% in each of the MD direction and the TD direction.

Moreover, as mentioned above, the polyimide film of the core layer, which polyimide film is used for the adhesive film of the present invention, has a property of effectively alleviating the heat stress. Accordingly, it is possible to reduce a dimensional change ratio of the obtained flexible metal-clad laminate, even if the flexible metal-clad laminate employs an adhesive film having equal to or less than 15 µm thickness that makes the adhesive film to be more easily influenced by the heat stress. Specifically, the dimensional change ratio before and after the heating at 250° C. for 30 minutes after the removal of the metal foil becomes in a range of −0.05 to +0.05% in each of the MD direction and the TD direction.

The heating process at the measurement for obtaining the dimensional change ratio is not specifically limited if the process heats the flexible metal-clad laminate at 250° C. for 30 minutes after the removal of the metal foil.

The flexible metal-clad laminate obtained by the production method of the present invention may be used as a flexible wiring board mounting various kinds of smaller elements in higher density if, as mentioned above, a desired pattern wiring is formed by etching a metal foil on the flexible metal-clad laminate. An application of the present invention is not limited to this embodiment, but various modifications are possible if a laminate includes a metal foil.

EXAMPLES

The present invention will now be described in specifics by way of examples. It is to be understood that the present invention is not limited to these examples.

The methods for evaluating the glass transition temperature of a thermoplastic polyimide, the storage modulus of the polyimide film, the tensile modulus of the polyimide film, the moisture expansion coefficient of the polyimide film, the angle of the molecular orientation axis of the polyimide film, the linear expansion coefficient of the polyimide film, the dimensional change ratio of a metal-clad flexible laminate, the metal foil peel-strength and the solder resistance against moisture absorption in Synthetic Examples, Examples, and Comparative Examples are as follows:

(Glass Transition Temperature)

The glass transition temperature was measured with DMS6100 manufactured by SII Nanotechnology Inc. The temperature at the inflection point of the storage modulus was assumed as the glass transition temperature.

Measured Sample Range; Width: 9 mm, Distance between Holding Tools: 20 mm
Measured Temperature Range; 0 to 440° C.
Heating Rate; 3° C./min
Strain Amplitude; 10 µm
Frequencies for measurement; 1, 5, and 10 Hz
Minimum Tension/Compressive Force; 100 mN
Tension/Compression Gain; 1.5
Initial Value of Force Amplitude; 100 mN (Storage Modulus of Core Film)

Storage modulus was measured by the same device and conditions as in the above-mentioned measurement of the glass transition temperature. The measurement was performed to the MD direction of the core film.

(Tensile Modulus)

The tensile modulus was measured in accordance with ASTM D882. The measurement was performed to the MD direction of the core film.

Measured Sample Range; Width: 15 mm, Distance between Holding Tools: 100 mm
Pulling Rate; 200 mm/min (Moisture Expansion Coefficient)

The moisture expansion coefficient was calculated from a variation measured with TMA/HUM-1 (a thermomechanical analyzer coupled with a humidity generator) manufactured by Rigaku Corporation. The measurement was performed at an angle of 45° to a molecular orientation axis of the core film.

Measured Sample Range; Width: 5 mm, Distance between Holding Tools: 15 mm
Measured Temperature; 50° C.
Temperature and Moisture Conditions; Kept at 80% R.H. for three hours after kept at 40% R.H for three hours (Angle of Molecular Orientation Axis of Film)

The angle θ of the molecular orientation axis of the core film was measured by the Microwave Molecular Orientation Analyzer MOA2012 A Manufactured by KS Systems Inc. The angle θ of the molecular orientation axis is defined as follows:

A direction of the molecular orientation (maximum direction of ∈', which is a dielectric constant) in the in-plane direction of a film can be worked out as a value of an angle by the molecular orientation analyzer. In the present invention, a line indicating the direction of the orientation is defined as the "orientation axis" of the sample.

As illustrated in FIG. 2, an x-axis was set at a center section of the film along a longitudinal direction (MD direction). A transfer direction of the polyamic acid flow-cast on the support is put as a positive direction. Here, an angle between the x-axis in the positive direction and the orientation axis obtained in the above-mentioned measurement is put as the angle θ of the orientation axis. When the orientation axis is in the first quadrant and the third quadrant, the angle of the orientation axis is defined to be positive ($0°<θ≦90°$). On the other hand, when the orientation axis is in the second quadrant and the fourth quadrant, the angle of the orientation axis is defined to be negative ($-90°≦θ<0°$). As illustrated in FIG. 3, the measurement of the angle of the orientation axis is performed at five points, which are end sections of the film, a center section of the film, and midpoints between respective end sections and the center section to the TD direction.

(Linear Expansion Coefficient)

The linear expansion coefficient of the polyimide film obtained was measured by using Thermo-mechanical Analysis Instrument TMA/SS6100 manufactured by SII Nanotechnology Inc. To measure the linear expansion coefficient, the polyimide film was heated from 0 to 460° C., and then cooled down to 10° C. After that, the polyimide film was heated at the heating rate of 10° C./min. The polyimide film was measured at 100° C. and 200° C. in the second heating. The measurement values were averaged to work out the linear expansion coefficient of the polyimide film. The measurement of linear expansion coefficient was performed to the MD direction and the TD direction of the core film.
Sample Size; Width 3 mm, Length 10 mm
Load; 29.4 mN
Temperature Range in Measurement: 0 to 460° C.
Heating Rate; 10° C./min (Dimensional Change Ratio)

According to JIS C6481, four holes were produced in the flexible laminate and respective distances between adjacent holes of the four holes were measured. After the measurement, the metal foil was removed from the flexible laminate by etching. The etched flexible laminate was left in a thermostatic room at 20° C. and 60% R.H. for 24 hours. Then, the respective distances between the adjacent holes of the four holes were measured as with the measurement before the etching. A dimensional change ratio before and after the etching was calculated by the following equation:

Dimensional Change Ratio (%)=$\{(D2-D1)/D1\}×100$ where D1 was a measured distance between adjacent holes of the four holes of the flexible laminate before etching, and D2 was a measured distance between the adjacent holes of the four holes of the flexible laminate after removal of the metal foil. Subsequently, the sample measured after the etching was heated at 250° C. for 30 minutes and then left in the thermostatic room at 20° C. and 60% R.H. for 24 hours. The respective distances between the adjacent holes of the four holes of this heated sample were measured. Then, the dimensional change ratio before and after the heating was calculated by the following equation:

Dimensional Change Ratio (%)=$\{(D3-D2)/D2\}×100$ where D3 was a measured distance between the adjacent holes of the four holes of the sample after the heating. The dimensional change ratio was measured in each of the MD direction and TD direction.

(Metal Foil Peel-Strength: Bonding Strength)

In accordance with Japanese Industrial Standard C6471, "6.5. Peel Strength", a sample was prepared, a load was measured, which was necessary to peel metal foil portion 5 mm wide at a peeling angle of 180° and 50 mm/min.

(Solder Resistance of Flexible Metal-Clad Laminate)

In accordance with Japanese Industrial Standard C6471, samples were prepared and solder resistance of the samples prepared under two conditions, which were an ordinary state (after adjusted at 20° C. and 85% R.H. for 24 hours) and a moisture absorption state (after adjusted at 85° C. and 85% R.H. for 96 hours), were measured to determine occurrence of abnormality appearing as a whitening and a delamination. The solder sample prepared in an ordinary state was dipped in solder at 300° C. for 1 minute, whereas the solder sample prepared in the moisture absorption state was dipped in solder at 260° C. for 10 seconds. As to the evaluation, the evaluation was determined as "good" when there was no change in the appearance of the sample before and after the solder dip. On the other hand, the evaluation was determined as "bad" when any of phenomena, such as peeling of the metal foil layer from the sample, whitening of the adhesive film, and expansion of the sample was observed.

Synthetic Example 1

Synthesis of Thermoplastic Polyimide Precursor

To a 2,000 mL glass flask, 780 g of N,N-dimethylformamide (hereinafter, also referred to as DMF) and 115.6 g of 2,2-bis[4-(4-aminophenoxy)phenyl]propane (hereinafter, also referred to as BAPP) were added. While the resulting mixture was being stirred in a nitrogen atmosphere, 78.7 g of 3,3',4,4'-biphenyltetracarboxylic dianhydride (hereinafter, also referred to as BPDA) was gradually added to the mixture. Subsequently, 3.8 g of 3,3',4,4'-ethylene glycol dibenzoate tetracarboxylic dianhydride (hereinafter, also referred to as TMEG) was added, and the resulting mixture was stirred in an ice bath for 30 minutes. A solution of 2.0 g of TMEG in 20 g of DMF was separately prepared and gradually added to the reaction solution while monitoring the viscosity under stirring. The addition and the stirring were ceased when the viscosity reached 3,000 poise. A polyamic acid solution thereby obtained was flow-cast on a 25 μm PET film (Cerapeel HP, produced by Toyo Metallizing Co., Ltd.) so that the final thickness was 20 μm, and dried at 120° C. for 5 minutes. The resulting self-supporting film after the drying was peeled from the PET film, held onto a metal pin frame, and dried at 150° C. for 5 minutes, at 200° C. for 5 minutes, at 250° C. for 5 minutes, and at 350° C. for 5 minutes. The glass transition temperature of thus obtained single-layer sheet was 240° C.

Examples 1 through 6

Synthesis of Polyimide Film

In a reaction system kept at 5° C., 3,4'-diaminodiphenyl ether (hereinafter also referred to 3,4'-ODA) and BAPP in a molar ratio shown in Table 1 were added to DMF, and stirred. After dissolution of 3,4'-ODA and BAPP was visually checked, benzophenonetetracarboxylic dianhydride (hereinafter, also referred to as BTDA) was added in a molar ratio shown in Table 1 and stirred for thirty minutes. Then, pyromellitic dianhydride (hereinafter, also referred to as PMDA) was added in a molar ratio shown in Table 1 and stirred for thirty minutes. Subsequently, p-phenylenediamine (hereinafter, also referred to as p-PDA) was added in a molar ratio shown in Table 1 and stirred for fifty minutes. Subsequently, PMDA was again added in a molar ration shown in Table 1 and stirred for thirty minutes.

At the end, 3 mol % of PMDA was dissolved into DMF to prepare a solution with solid content of 7%. The solution prepared was gradually added to the above-mentioned reaction solution while monitoring the viscosity under stirring. The polymerization was ceased when the viscosity reached 4,000 poise at 20° C.

To this polyamic acid solution, an imidization accelerator composed of acetic anhydride/isoquinoline/DMF (ratio of 2.0/0.3/4.0 based on weight) was added so as to be a ratio of 45% based on weight to the polyamic acid solution and continuously stirred by a mixer. The resulting mixture was extruded from a T die and flow-cast on an endless belt made of stainless steel that runs 20 mm below the die. This resin film was heated at 130° C. for 100 seconds. The resulting self-supporting gel film (residual volatile content: 30 wt %) was peeled off from the endless belt. This resulting gel film was held on a tenter clip and then transferred into a heating furnace. The gel film was dried in a hot-air drying furnace at 300° C. for 30 seconds, in a hot-air drying furnace at 400° C. for 30 seconds, and in an IR furnace at 500° C. for 30 seconds for continuous drying and imidization. As a result, a polyimide film having a thickness of 18 µm was obtained.

Example 7

Synthesis of Polyimide Film

To the polyamic acid solution obtained in the procedure as in Example 1, an imidization accelerator composed of acetic anhydride/isoquinoline/DMF (ratio of 2.0/0.3/4.0 based on weight) was added so as to be a ratio of 45% based on weight to the polyamic acid solution and continuously stirred by a mixer. The resulting mixture was supplied from a T die and flow-cast on an endless belt made of stainless steel that runs 20 mm below the die. This resin film was heated at 110° C. for 100 seconds. The resulting self-supporting gel film (residual volatile content: 50 wt %) was peeled off from the endless belt. This resulting gel film was held on a tenter clip and then transferred into a heating furnace. The gel film was dried in a hot-air drying furnace at 300° C. for 30 seconds, in a hot-air drying furnace at 400° C. for 30 seconds, and in an IR furnace at 500° C. for 30 seconds for continuous drying and imidization. As a result, a polyimide film having a thickness of 18 µm was obtained. In this Example, when the gel film was peeled off from the endless belt and the end sections of this gel film were held on a tenter clip, the gel film was held so as to have substantially no tension in the TD direction. The TD shrinkage ratio was 4% here.

Example 8

Synthesis of Polyimide Film

With the polyamic acid solution obtained by the procedure as in Example 2, the procedure as in Example 7 was carried out. As a result, a polyimide film having a thickness of 18 µm was obtained.

Example 9

Synthesis of Polyimide Film

To the polyamic acid solution obtained in the procedure as in Example 1, an imidization accelerator composed of acetic anhydride/isoquinoline/DMF (ratio of 2.0/0.3/4.0 based on weight) was added so as to be a ratio of 45% based on weight to the polyamic acid solution and continuously stirred by a mixer. The resulting mixture was supplied from a T die and flow-cast on an endless belt made of stainless steel that runs 20 mm below the die. This resin film was heated at 130° C. for 70 seconds. The resulting self-supporting gel film (residual volatile content: 30 wt %) was peeled off from the endless belt. This resulting gel film was held on a tenter clip and then transferred into a heating furnace. The gel film was dried in a hot-air drying furnace at 300° C. for 22 seconds, in a hot-air drying furnace at 400° C. for 22 seconds, and in an IR furnace at 500° C. for 22 seconds for continuous drying and imidization. As a result, a polyimide film having a thickness of 10 µm was obtained.

Examples 10 through 14

Synthesis of Polyimide Film

With the polyamic acid solutions obtained respectively by the procedures as in Examples 2 through 6, the procedure as in Example 9 was carried out. As a result, a polyimide film having a thickness of 10 µm was obtained.

Example 15

Synthesis of Polyimide Film

To the polyamic acid solution obtained by the procedure as in Example 1, an imidization accelerator composed of acetic anhydride/isoquinoline/DMF (ratio of 2.0/0.3/4.0 based on weight) was added so as to be a ratio of 45% based on weight to the polyamic acid solution and continuously stirred by a mixer. The resulting mixture was supplied from a T die and flow-cast on an endless belt made of stainless steel that runs 20 mm below the die. This resin film was heated at 110° C. for 70 seconds. The resulting self-supporting gel film (residual volatile content: 50 wt %) was peeled off from the endless belt. This resulting gel film was held on a tenter clip and then transferred into a heating furnace. The gel film was dried in a hot-air drying furnace at 300° C. for 22 seconds, in a hot-air drying furnace at 400° C. for 22 seconds, and in an IR furnace at 500° C. for 22 seconds for continuous drying and imidization. As a result, a polyimide film having a thickness of 10 µm was obtained. In this Example, when the gel film was peeled off from the endless belt and the end sections of this gel film were held on a tenter clip, the gel film was held so as to have substantially no tension in the TD direction. The TD shrinkage ratio was 4% here.

Example 16

Synthesis of Polyimide Film

With the polyamic acid solution obtained by the procedures as in Example 2, the procedure as in Example 15 was carried out. As a result, a polyimide film having a thickness of 10 µm was obtained.

Examples 17 through 32

A precursor of the thermoplastic polyimide, which was obtained in Synthetic Example 1, was applied by a gravure coater on both sides of each of the polyimide films obtained in Examples 1 through 16. When the polyimide films used here were obtained in Examples 1 through 8, the precursor of the thermoplastic polyimide was applied so that the final thickness of the thermoplastic polyimide layer (adhesive layer) became 3.5 µm on each side. When the polyimide films used were obtained in Examples 9 through 16, the precursor was applied so that the final thickness of the thermoplastic polyimide layer (adhesive layer) became 2 μm on each side. The polyimide film, on which the precursor of the thermoplastic polyimide was applied, was heated in a drying furnace at 140° C. for 1 minute. Subsequently, the polyimide film was passed through a far-infrared heating furnace at an atmosphere temperature of 390° C. for 20 seconds to conduct thermal imidization and to thereby obtain an adhesive film. An 18 μm rolled copper foil (BHY-22B-T, produced by Japan Energy Corporation) was provided on each side of the resulting adhesive film, and then a protective material (Apical 125NPI produced by Kaneka Corporation) was provided on each copper foil, under a laminating condition such that the tension applied on the polyimide film was 0.4 N/cm; the laminating temperature was 380° C.; the laminating pressure was 196N/cm (20 kgf/cm); and the laminating speed was 1.5 m/min. As a result, a flexible metal-clad laminate was obtained. The protective film used here was preliminarily heated by touching to the heating roller for three seconds, and then, laminated on the outer surface of the copper foil. Moreover, after the lamination, the laminate provided with the protective film was brought into contact with the heating roller for 0.2 second. Then, the laminate was naturally cooled off and the protective film cooled down was peeled off from the laminate.

Comparative Example 1

The polyamic acid solution obtained in synthetic Example 1 was diluted with DMF to a solid content of 10 wt %. The resulting solution was applied by a gravure coater onto both sides of the polyimide film (Apical 18HPP produced by Kaneka Corporation) having a thickness of 18 μm so that the final thickness of the thermoplastic polyimide layer became 3.5 μm on each side and heated in a drying furnace at 140° C. for 1 minute. Subsequently, the film was passed through a far-infrared heating furnace at an atmosphere temperature of 390° C. for 20 seconds to conduct thermal imidization and to thereby obtain an adhesive film. An 18 μm rolled copper foil (BHY-22B-T, produced by Japan Energy Corporation) was laminated on each side of the resulting adhesive film, and then a protective material (Apical 125NPI produced by Kaneka Corporation) was laminated on each copper foil, under a laminating condition such that the tension applied on the polyimide film was 0.4 N/cm; the laminating temperature was 380° C.; the laminating pressure was 196N/cm (20 kgf/cm); and the laminating speed was 1.5 m/min. As a result, a flexible metal-clad laminate was obtained.

Comparative Example 2

The flexible metal-clad laminate was produced by the procedure as in the Comparative Example 1, other than that the polyimide film (Apical 10HPP produced by Kaneka Corporation) having a thickness of 10 μm was used as a core film and thickness of the thermoplastic polyimide layer became 2 μm on each side.

Comparative Example 3

The flexible metal-clad laminate was produced by the procedure as in the Comparative Example 1, other than that the polyimide film (Apical 20NPP produced by Kaneka Corporation) having a thickness of 20 μm was used as a core film and thickness of the thermoplastic polyimide layer became 2 μm on each side.

Comparative Example 4

The flexible metal-clad laminate was produced by the procedure as in the Comparative Example 1, other than that the polyimide film (Apical 12.5NPP produced by Kaneka Corporation) having a thickness of 12.5 μm was used as a core film and thickness of the thermoplastic polyimide layer became 1.5 μm on each side.

Results of evaluating the properties of the polyimide film and the flexible metal-clad laminate obtained in the Examples and the Comparative Examples are shown in Tables 2 through 4.

TABLE 1

|  | 3,4'-ODA | BAPP | BTDA | PMDA (FIRST TIME) | p-PDA | PMDA (SECOND TIME) |
|---|---|---|---|---|---|---|
| EXAMPLE 1 | 20 | 25 | 20 | 20 | 55 | 57 |
| EXAMPLE 2 | 30 | 20 | 20 | 25 | 50 | 52 |
| EXAMPLE 3 | 30 | 20 | 10 | 35 | 50 | 52 |
| EXAMPLE 4 | 20 | 30 | 20 | 25 | 50 | 52 |
| EXAMPLE 5 | 10 | 40 | 20 | 25 | 50 | 52 |
| EXAMPLE 6 | 20 | 30 | 10 | 35 | 50 | 52 |

TABLE 2

|  | INFLECTION POINT OF STORAGE MODULUS (° C.) | STORAGE MODULUS AT 380° C. (GPa) | PEAK TOP OF TAN σ (° C.) | $\{(\alpha_1 - \alpha_2)/\alpha_1\} \times 100$ | TENSILE MODULUS (GPa) | MOISTURE EXPANSION COEFFICIENT (ppm/° C.) | LINEAR EXPANSION COEFFICIENT (ppm/° C.) MD | LINEAR EXPANSION COEFFICIENT (ppm/° C.) TD |
|---|---|---|---|---|---|---|---|---|
| EXAMPLE 1 | 284 | 1.3 | 351 | 74 | 7.9 | 10.7 | 5.1 | 5.0 |
| EXAMPLE 2 | 290 | 1.2 | 348 | 78 | 7.9 | 11.1 | 6.5 | 6.5 |
| EXAMPLE 3 | 304 | 1.6 | 365 | 66 | 7.6 | 10.9 | 6.5 | 6.7 |
| EXAMPLE 4 | 284 | 1.1 | 338 | 81 | 7.2 | 10.8 | 9.1 | 9.0 |
| EXAMPLE 5 | 277 | 1.0 | 336 | 84 | 7.0 | 10.4 | 12.6 | 12.4 |
| EXAMPLE 6 | 303 | 1.5 | 362 | 74 | 7.1 | 10.6 | 8.6 | 8.6 |
| EXAMPLE 7 | 282 | 1.3 | 354 | 73 | 8.2 | 10.5 | 4.5 | 5.7 |
| EXAMPLE 8 | 290 | 1.1 | 347 | 76 | 8.2 | 11.3 | 4.7 | 8.5 |
| EXAMPLE 9 | 286 | 1.4 | 355 | 75 | 7.9 | 10.2 | 5.3 | 5.4 |
| EXAMPLE 10 | 289 | 1.0 | 346 | 77 | 8.0 | 10.8 | 6.5 | 6.6 |
| EXAMPLE 11 | 305 | 1.7 | 367 | 65 | 7.8 | 10.7 | 6.7 | 6.7 |
| EXAMPLE 12 | 284 | 1.3 | 339 | 80 | 7.2 | 10.6 | 9.2 | 9.0 |
| EXAMPLE 13 | 279 | 1.2 | 337 | 83 | 7.1 | 10.0 | 12.4 | 12.6 |
| EXAMPLE 14 | 301 | 1.4 | 365 | 76 | 7.0 | 10.3 | 8.8 | 8.6 |

TABLE 2-continued

| | INFLECTION POINT OF STORAGE MODULUS (° C.) | STORAGE MODULUS AT 380° C. (GPa) | PEAK TOP OF TAN σ (° C.) | {($\alpha_1$ − $\alpha_2$)/ $\alpha_1$} × 100 | TENSILE MODULUS (GPa) | MOISTURE EXPANSION COEFFICIENT (ppm/° C.) | LINEAR EXPANSION COEFFICIENT (ppm/° C.) | |
|---|---|---|---|---|---|---|---|---|
| | | | | | | | MD | TD |
| EXAMPLE 15 | 283 | 1.2 | 355 | 74 | 8.4 | 10.5 | 4.3 | 5.9 |
| EXAMPLE 16 | 292 | 1.3 | 350 | 77 | 8.5 | 11.1 | 4.8 | 8.7 |
| COMPARATIVE EXAMPLE 1 | 278 | 0.6 | 310 | 77 | 6.0 | 7.8 | 12.4 | 12.0 |
| COMPARATIVE EXAMPLE 2 | 280 | 0.8 | 308 | 70 | 5.8 | 7.5 | 11.6 | 11.0 |
| COMPARATIVE EXAMPLE 3 | — | 2.7 | — | — | 4.4 | 15.5 | 16.4 | 15.5 |
| COMPARATIVE EXAMPLE 4 | — | 2.4 | — | — | 4.2 | 15.0 | 16.6 | 15.8 |

*$\alpha_1$: STORAGE MODULUS AT INFLECTION POINT (GPa)
*$\alpha_2$: STORAGE MODULUS AT 380° C. (GPa)
*COMPARATIVE EXAMPLES 1 to 4; PHYSICAL PROPERTIES OF CORE FILM USED FOR ADHESIVE FILM USED IN COMPARATIVE EXAMPLE IS DESCRIBED

TABLE 3

| | ANGLE OF MOLECULAR ORIENTATION AXIS (°) | | | | |
|---|---|---|---|---|---|
| | E | EC | C | WC | W |
| EXAMPLE 7 | −5 | 3 | 1 | −2 | 3 |
| EXAMPLE 8 | 4 | −1 | 3 | 4 | −1 |
| EXAMPLE 15 | −2 | 3 | 2 | −1 | 4 |
| EXAMPLE 16 | 5 | 4 | 2 | 0 | −2 |

TABLE 4

| | DIMENSIONAL CHANGE AFTER ETCHING (%) | | DIMENSIONAL CHANGE AFTER HEATING (%) | | BONDING STRENGTH | SOLDER RESISTANCE | |
|---|---|---|---|---|---|---|---|
| | | | | | | ORDINARY STATE | MOISTURE ABSORPTION STATE |
| | MD | TD | MD | TD | (N/cm) | | |
| EX. 17 | +0.03 | +0.07 | −0.04 | +0.03 | 17.0 | Good | Good |
| EX. 18 | +0.04 | +0.08 | −0.04 | +0.03 | 16.6 | Good | Good |
| EX. 19 | −0.03 | +0.08 | −0.03 | +0.04 | 15.8 | Good | Good |
| EX. 20 | +0.04 | +0.08 | −0.04 | +0.03 | 17.5 | Good | Good |
| EX. 21 | −0.01 | +0.04 | −0.01 | +0.04 | 18.0 | Good | Good |
| EX. 22 | +0.03 | +0.06 | −0.01 | +0.03 | 18.0 | Good | Good |
| EX. 23 | +0.03 | −0.01 | −0.03 | +0.03 | 17.6 | Good | Good |
| EX. 24 | +0.03 | 0.00 | −0.04 | +0.03 | 17.7 | Good | Good |
| EX. 25 | −0.04 | +0.05 | −0.05 | +0.03 | 15.3 | Good | Good |
| EX. 26 | −0.03 | +0.04 | −0.04 | +0.04 | 16.2 | Good | Good |
| EX. 27 | −0.05 | +0.04 | −0.03 | +0.04 | 17.4 | Good | Good |
| EX. 28 | +0.02 | +0.07 | −0.03 | +0.02 | 16.2 | Good | Good |
| EX. 29 | −0.02 | +0.03 | −0.02 | +0.02 | 16.4 | Good | Good |
| EX. 30 | −0.03 | +0.05 | −0.05 | +0.02 | 16.7 | Good | Good |
| EX. 31 | +0.04 | +0.02 | −0.03 | +0.04 | 17.5 | Good | Good |
| EX. 32 | −0.03 | +0.01 | −0.04 | +0.03 | 17.7 | Good | Good |
| COM. EX. 1 | −0.03 | +0.04 | −0.10 | +0.06 | 9.0 | Good | Good |
| COM. EX. 2 | −0.04 | +0.09 | −0.13 | +0.13 | 8.5 | Good | Good |
| COM. EX. 3 | −0.20 | +0.25 | −0.17 | +0.20 | 12.5 | Good | Bad |
| COM. EX. 4 | −0.23 | +0.30 | −0.22 | +0.25 | 10.8 | Good | Bad |

ABBREVIATION:
EX. stands for "Example".
Com. Ex. stands for "Comparative Example".

As described in the Comparative Examples 1 through 4, when the storage modulus, peak top of tan σ, of the core film was out of the predetermined range, stress applied on the material during thermal lamination could not be alleviated efficiently. This resulted in a large dimensional change ratio. Especially, the thinner thickness of the adhesive film resulted in a larger dimensional change ratio.

On the other hand, in Examples 17 through 32 where all properties of the core film used were in the predetermined range, occurrence of the dimensional changes were suppressed even when the flexible metal-clad laminate was produced with the thermal laminating method. Especially, in Examples 25 through 32 where the thickness of the adhesive film was thin, the dimensional change ratio was substantially equal to that of the Examples 17 through 24. Moreover, the result showed that control of the storage modulus did not affect bonding strength and solder resistance and also did not cause any problem in a practical application.

EXPLANATION ON REFERENCE

Figure 1:
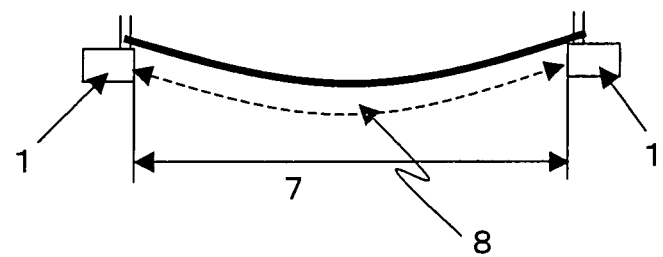
FIG. 1 schematically illustrates a production apparatus of a polyimide film.
Figure 2:
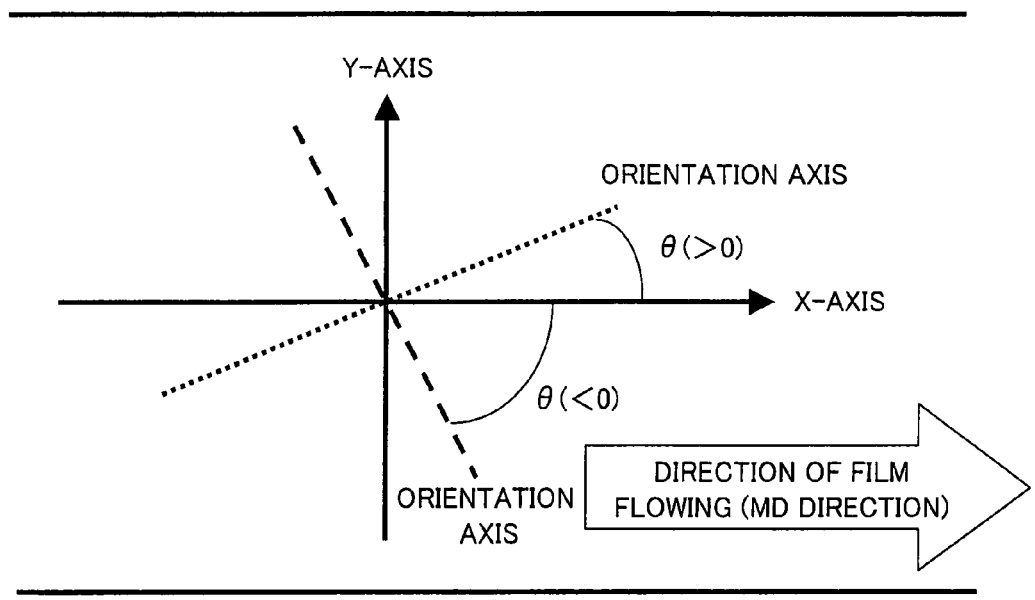
FIG. 2 is a diagram illustrating measurement of an angle of a molecular orientation axis in the film.
Figure 3:
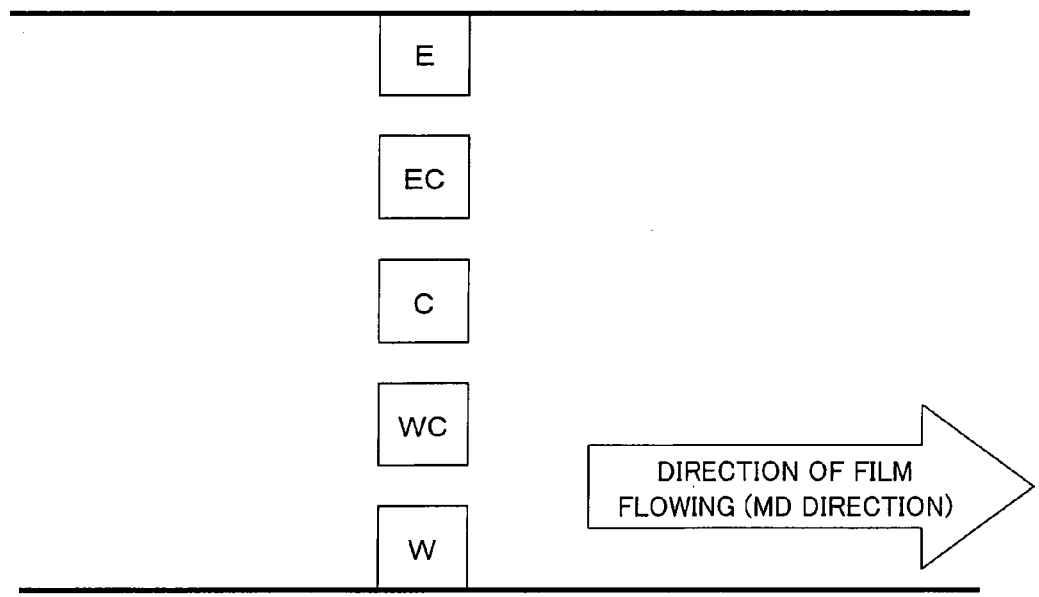
FIG. 3 is a diagram illustrating a sampling point for the angle of the molecular orientation axis.

1 Gel Film holding Member (Gel Film End Sections Holding Device)
7 Distance Between Held end Sections of Film
8 Gel Film Width Between Held end Sections

INDUSTRIAL APPLICABILITY

The polyimide film of the present invention can suppress a dimensional change that would occur in the production process of a flexible copper-clad laminate. Especially, the polyimide film has an inflection point of the storage modulus in order to alleviate heat stress during lamination operation and the storage modulus is controlled. As a result, the dimensional change is effectively suppressed in a flexible metal-clad laminate prepared by adhering, by a lamination method, a metal foil on an adhesive film whose core is made of the polyimide film. More specifically, the dimensional change of the film before and after heating the film at 250° C. for min after removal of the metal foil can be restrained within −0.04 to +0.04% in both the MD direction and TD direction. Therefore, the polyimide film of the present invention is preferably applicable to FPC on which fine wiring has been formed, or the like. The polyimide film of the present invention can solve problems such as positional shifting etc.

The invention claimed is:

1. A polyimide film produced by imidizing a polyamic acid prepared by reacting an aromatic diamine and an aromatic dianhydride,
the polyimide film being prepared from a polyimide polymer comprising a block component derived from a thermoplastic polyimide and wherein the ultimately obtained polyimide film is non-thermoplastic, the polyimide film satisfying all the conditions (i) to (iv):
(i) an inflection point of a storage modulus of the polyimide film is in a range of 270 to 340° C.;
(ii) a peak top of tan δ is in a range of 320 to 410° C., where tan δ is a value obtained by dividing a loss modulus by the storage modulus;
(iii) the storage modulus at 380° C. is in a range of 0.4 to 2.0GPa; and
(iv) the storage modulus α1 (GPa) at the inflection point and the storage modulus α2 (GPa) at 380° C. is in a range of the following Equation (1):

$$85 \geq \{(\alpha 1 - \alpha 2)/\alpha 1\} \times 100 \geq 65 \qquad (1),$$

wherein measurement for the storage modulus, the inflection point of the storage modulus, the peak top of tan δ, and the storage modulus at 380° C. is done at 5Hz.

2. The polyimide film as set forth in claim 1, having a tensile modulus of 6.0 GPa or greater.

3. The polyimide film as set forth in claim 1, wherein the polyimide film has a moisture expansion coefficient of 13ppm/° C. or less, the moisture expansion coefficient being measured after the polyimide film is kept at 50° C. and 40% RH. for 3 hours and then at 80% RH. for 3 hours.

4. The polyimide film as set forth in claim 1, having a linear expansion coefficient of 15ppm/° C. or less from 100° C. to 200° C.

5. The polyimide film as set forth in claim 1, having an angle of molecular orientation axis in a range of −15 degrees to 15 degrees to a film transfer direction (MD direction).

6. The polyimide film as set forth in claim 5, wherein the polyimide film is obtained by a method for producing an organic insulating film, the method including:
(A) polymerizing to form a polyamic acid;
(B) flow-casting and spreading a composition containing the polyamic acid and an organic solvent onto a support and forming a gel film;
(C) peeling off the resulting gel film from the support and holding the gel film at its edges; and
(D) transferring the film held at its edges in a heating furnace, wherein the step (D) at least includes the step of (D-1) transferring the film held in a manner such that the film has substantially no tension in a film width direction (TD direction) in at least part of the step (D).

7. The polyimide film as set forth in claim 1 being obtained by performing imidization with a polyamic acid solution obtained by carrying out the steps of:
(a) reacting, in an organic polar solvent, an aromatic acid dianhydride and an aromatic diamine compound being greater in a molar amount than the aromatic acid dianhydride, so as to obtain a prepolymer having an amino group at each end;
(b) sequentially, further adding an aromatic diamine compound; and
(c) performing polymerization after further adding an aromatic acid dianhydride in an amount that makes up a substantially equimolar amount of the aromatic acid dianhydride to the aromatic diamine in an overall process.

8. The polyimide film as set forth in claim 7, wherein the aromatic diamine compound used in step (a) is a diamine having a soft structure, and the aromatic diamine compound used in step (b) is a diamine having a rigid structure.

9. The polyimide film as set forth in claim 8, wherein 3,4'-diaminodiphenylether is 10mol % or more to the whole diamine component in the production of the polyimide film.

10. An adhesive film comprising:
a polyimide film as set forth in claim 1 and
an adhesive layer on at least one side of the polyimide film, the adhesive layer containing a thermoplastic polyimide.

11. The adhesive film as set forth in claim 10, wherein:
the thermoplastic polyimide has a glass transition temperature (Tg) of 230° C. or higher.

12. The adhesive film as set forth in claim 10 being 15μm or less in film thickness.

13. A flexible metal-clad laminate produced by adhering an adhesive film as set forth in claim 10 and a metal foil by using a heat roll laminating apparatus having one or more pairs of metal rollers.

14. The flexible metal-clad laminate as set forth in claim 13, wherein the step of adhering includes:
performing lamination in which a protective material is provided between the metal foil and one roller, the protective film being made of a non-thermoplastic polyimide or a thermoplastic polyimide which has a glass transition temperature (Tg) that is higher than a lamination temperature by 50° C. or more; and
separating the protective material after post-lamination cooling.

15. The flexible metal-clad laminate as set forth in claim 14, wherein before the separating of the protective material but after the lamination, a laminate in which the protective film and the flexible metal-clad laminate are attached with each other is touched with a heating roller in a period in a range of 0.1 to 5 seconds, and the laminate is cooled before separating the protective material.

16. The flexible metal-clad laminate as set forth in claim 13, wherein a dimensional change of the flexible metal-clad laminate before and after heating the flexible metal-clad laminate at 250° C. for 30 minutes after the removal of the metal foil is in a range of −0.04 to +0.04% in each of an MD direction and a TD direction.

17. The flexible metal-clad laminate as set forth in claim 13, wherein the flexible metal-clad laminate has an adhesive film of 15μm in thickness, and a dimensional change of the flexible metal-clad laminate before and after heating the flexible metal-clad laminate at 250° C. for 30 minutes after the removal of the metal foil is in a range of −0.05 to +0.05% in each of an MD direction and a TD direction.

\* \* \* \* \*

UNITED STATES PATENT AND TRADEMARK OFFICE
CERTIFICATE OF CORRECTION

PATENT NO. : 8,426,548 B2  Page 1 of 1
APPLICATION NO. : 11/663622
DATED : April 23, 2013
INVENTOR(S) : Kikuchi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 725 days.

Signed and Sealed this
Eighth Day of September, 2015

Michelle K. Lee
*Director of the United States Patent and Trademark Office*